(12) United States Patent
Yu et al.

(10) Patent No.: US 10,615,162 B2
(45) Date of Patent: Apr. 7, 2020

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Hyun Kwan Yu, Suwon-si (KR); Won Hyung Kang, Seoul (KR); Hyo Jin Kim, Hwaseong-si (KR); Sung Bu Min, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/801,797

(22) Filed: Nov. 2, 2017

(65) Prior Publication Data

US 2018/0358358 A1  Dec. 13, 2018

(30) Foreign Application Priority Data

Jun. 7, 2017 (KR) .................. 10-2017-0070815

(51) Int. Cl.
*H01L 27/088* (2006.01)
*H01L 21/762* (2006.01)
(Continued)

(52) U.S. Cl.
CPC .... *H01L 27/0886* (2013.01); *H01L 21/76224* (2013.01); *H01L 21/823425* (2013.01); *H01L 21/823431* (2013.01); *H01L 21/823437* (2013.01); *H01L 21/823468* (2013.01); *H01L 21/823475* (2013.01); *H01L 21/823481* (2013.01); *H01L 27/0207* (2013.01); *H01L 29/045* (2013.01); *H01L 29/0649* (2013.01); *H01L 29/0847* (2013.01); *H01L 29/36* (2013.01); *H01L 29/665* (2013.01); *H01L 29/66545* (2013.01); *H01L 29/66636* (2013.01);
(Continued)

(58) Field of Classification Search
CPC ......... H01L 21/823425; H01L 29/7853; H01L 29/66636; H01L 21/823431; H01L 29/667495; H01L 29/7848
See application file for complete search history.

(56) References Cited

U.S. PATENT DOCUMENTS

| 7,723,193 B2 | 5/2010 | Rhee et al. |
| 7,994,014 B2 | 8/2011 | Yang et al. |

(Continued)

*Primary Examiner* — Samuel A Gebremariam
*Assistant Examiner* — Jonas T Beardsley
(74) *Attorney, Agent, or Firm* — Harness, Dickey & Pierce, P.L.C.

(57) ABSTRACT

The semiconductor device includes a first fin-type pattern and a second fin-type pattern which extends along a first direction; a first gate structure and a second gate structure extending in a second direction, on the first fin-type pattern and the second fin-type pattern; and a shared epitaxial pattern which connects the first fin-type pattern and the second fin-type pattern between the first gate structure and the second gate structure. An upper surface of the shared epitaxial pattern includes a first shared slope and a second shared slope which connect the first gate structure and the second gate structure, a third shared slope which is in contact with the first gate structure and connects the first shared slope and the second shared slope, and a fourth shared slope which is in contact with the second gate structure and connects the first shared slope and the second shared slope.

13 Claims, 27 Drawing Sheets

(51) Int. Cl.
*H01L 29/04* (2006.01)
*H01L 29/06* (2006.01)
*H01L 29/36* (2006.01)
*H01L 29/78* (2006.01)
*H01L 21/8234* (2006.01)
*H01L 29/66* (2006.01)
*H01L 29/08* (2006.01)
*H01L 27/02* (2006.01)
*H01L 29/165* (2006.01)

(52) U.S. Cl.
CPC ...... *H01L 29/7848* (2013.01); *H01L 29/7853* (2013.01); *H01L 29/165* (2013.01)

(56) References Cited

U.S. PATENT DOCUMENTS

| | | |
|---|---|---|
| 9,153,496 B2 | 10/2015 | Wong et al. |
| 9,412,746 B2 | 8/2016 | Yang |
| 9,515,167 B2 | 12/2016 | Lu et al. |
| 9,515,187 B2 | 12/2016 | Kwok et al. |
| 2014/0363935 A1* | 12/2014 | Fu ..................... H01L 29/66545 438/164 |
| 2015/0035023 A1* | 2/2015 | Kim ..................... H01L 29/785 257/288 |
| 2015/0099336 A1* | 4/2015 | Wong ............. H01L 21/823418 438/229 |
| 2016/0293717 A1 | 10/2016 | Kim et al. |
| 2017/0025537 A1 | 1/2017 | Ching et al. |
| 2017/0033223 A1* | 2/2017 | Leobandung ....... H01L 21/7682 |

\* cited by examiner

SEMICONDUCTOR DEVICE AND METHOD FOR FABRICATING THE SAME

This application claims priority from Korean Patent Application No. 10-2017-0070815 filed on Jun. 7, 2017 in the Korean Intellectual Property Office, the disclosure of which is incorporated herein by reference in its entirety.

BACKGROUND OF THE INVENTION

1. Technical Field

The present inventive concept relates to a semiconductor device and a method for fabricating the same. Specifically, the present inventive concept relates to a semiconductor device including an epitaxial pattern, and a method for fabricating the same.

2. Discussion of Related Art

As one of scaling techniques for enhancing the density of a semiconductor device, a multi-gate transistor in which a pin-shaped silicon body is formed on a substrate and a gate is formed on the surface of the silicon body has been suggested.

Since such a multi-gate transistor utilizes three-dimensional channels, it can be scaled. Further, the current control capability can be improved without increasing the gate length of the multi-gate transistor. It is also possible to effectively suppress short channel effect (SCE) in which the potential of the channel region is affected by the drain voltage.

SUMMARY OF THE INVENTION

An aspect of the present inventive concept provides a semiconductor device in which a contact resistance is improved and a short circuit is prevented.

Another aspect of the present inventive concept provides a method for fabricating a semiconductor device in which a contact resistance is improved, a short circuit is prevented, and the product reliability is improved.

According to aspects of the present inventive concept, there is provided a semiconductor device comprising, a first fin-type pattern and a second fin-type pattern which extend on a substrate along a first direction, respectively, a first gate structure and a second gate structure which are spaced apart from each other in a second direction intersecting with the first direction, on the first fin-type pattern and the second fin-type pattern, and a shared epitaxial pattern which connects the first fin-type pattern and the second fin-type pattern between the first gate structure and the second gate structure, wherein an upper surface of the shared epitaxial pattern includes a first shared slope and a second shared slope which connect the first gate structure and the second gate structure, a third shared slope which is in contact with the first gate structure and connects the first shared slope and the second shared slope, and a fourth shared slope which is in contact with the second gate structure and connects the first shared slope and the second shared slope.

According to aspects of the present inventive concept, there is provided a semiconductor device comprising, a first fin-type pattern and a second fin-type pattern on a substrate, and a shared epitaxial pattern which connects the first fin-type pattern and the second fin-type pattern, wherein the shared epitaxial pattern includes a first epitaxial layer on the first fin-type pattern, a second epitaxial layer on the second fin-type pattern, a first connecting epitaxial layer interposed between the first epitaxial layer and the second epitaxial layer, and a capping epitaxial layer on the first epitaxial layer, the second epitaxial layer and the first connecting epitaxial layer, an uppermost part of the capping epitaxial layer being higher than an uppermost part of the first epitaxial layer, an uppermost part of the second epitaxial layer, and an uppermost part of the first connecting epitaxial layer.

According to aspects of the present inventive concept, there is provided a semiconductor device comprising, a first fin-type pattern on a substrate, a first gate structure and a second gate structure which intersect with the first fin-type pattern and are adjacent to each other on the first fin-type pattern and a shared epitaxial pattern on the first fin-type pattern between the first gate structure and the second gate structure, wherein the first fin-type pattern includes a first trench formed between the first gate structure and the second gate structure, the shared epitaxial pattern includes a first epitaxial layer which fills the first trench, and a capping epitaxial layer on the first epitaxial layer, a lower surface of the capping epitaxial layer is higher than an upper surface of the first fin-type pattern, and the upper surface of the capping epitaxial layer has an inclination with respect to the upper surface of the substrate.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE INVENTION

Hereinafter, a semiconductor device according to some embodiments of the present inventive concept will be described with reference to FIGS. 1 to 5.

Figure 1:
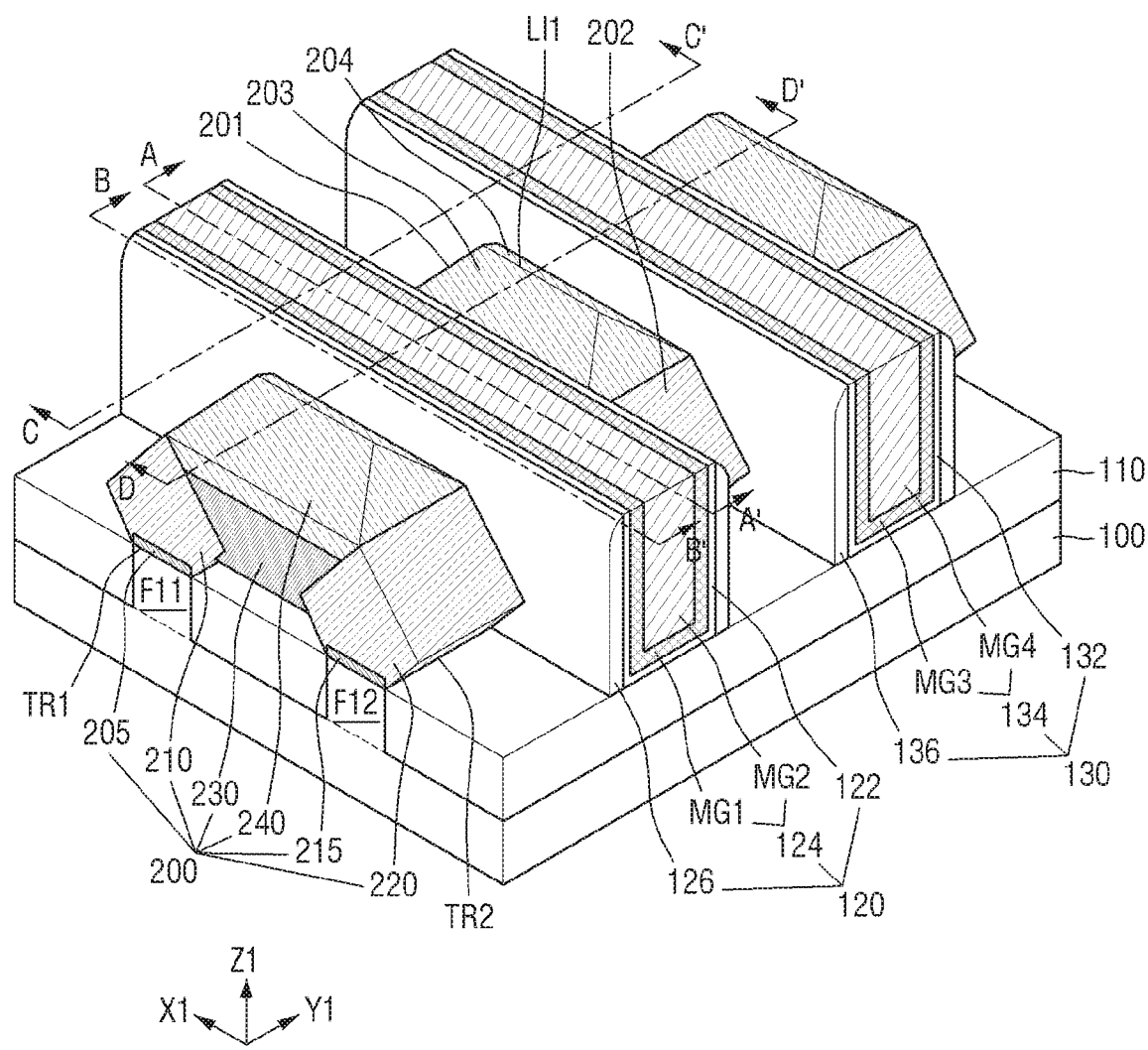
FIG. 1 is a perspective view illustrating a semiconductor device according to some embodiments of the present inventive concept.
Figure 2:
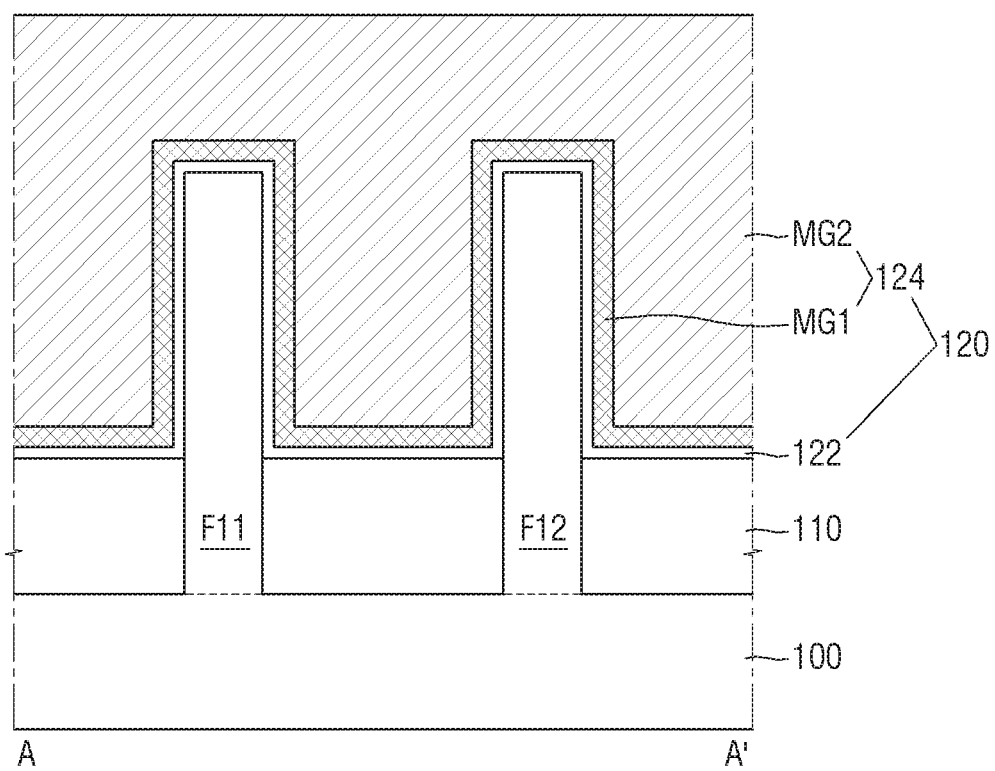
FIG. 2 is a cross-sectional view taken along the line A-A' of FIG. 1.
Figure 3:
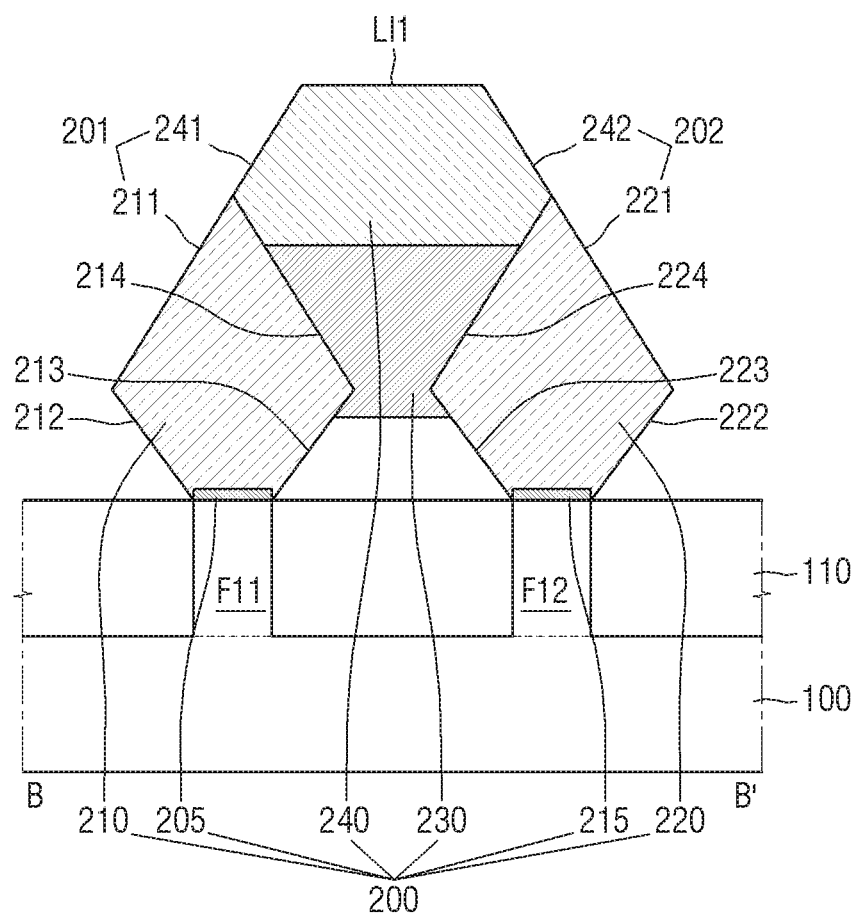
FIG. 3 is a cross-sectional view taken along the line B-B' of FIG. 1.
Figure 4:
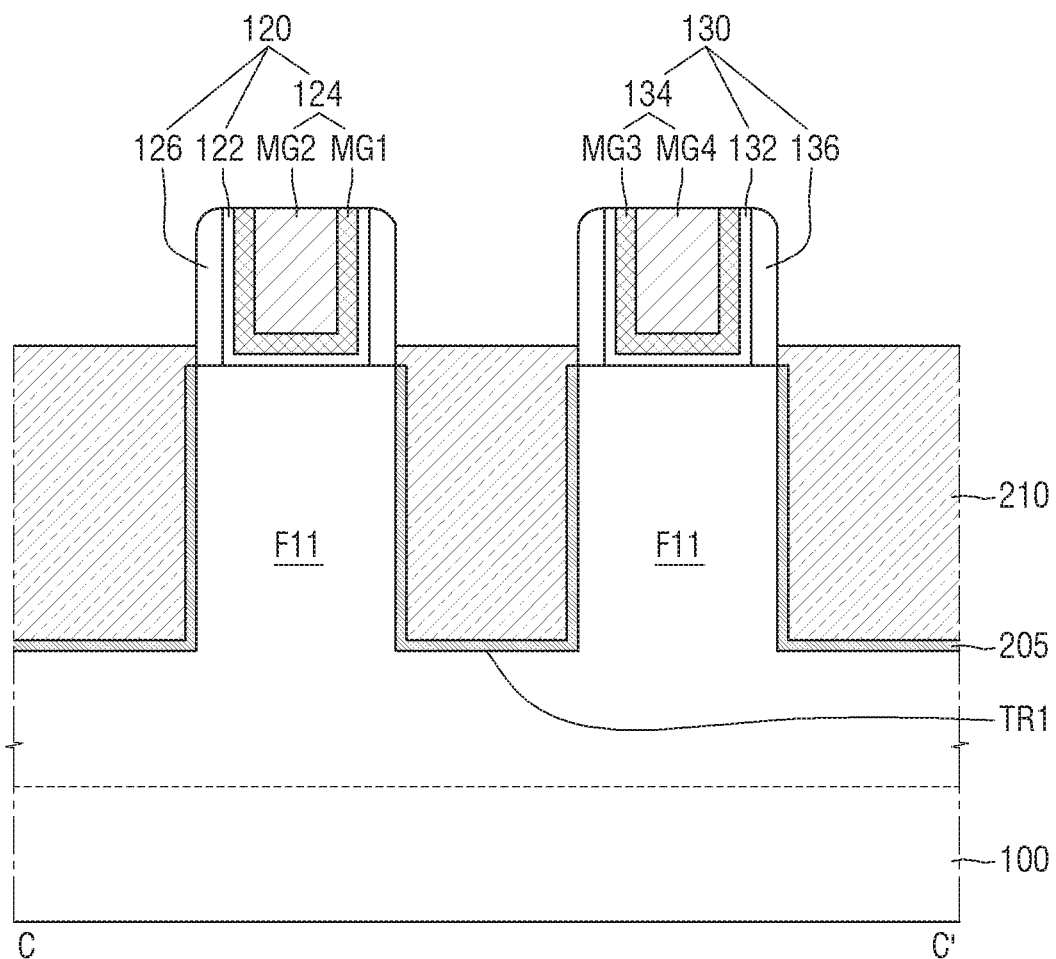
FIG. 4 is a cross-sectional view taken along the line C-C' of FIG. 1.

FIG. 1 is a perspective view illustrating a semiconductor device according to some embodiments of the present inventive concept. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1.

Referring to FIGS. 1 to 5, a semiconductor device according to some embodiments of the present inventive concept includes a substrate 100, a first fin-type pattern F11, a second fin-type pattern F12, a field insulating film 110, a first gate structure 120, a second gate structure 130, and a shared epitaxial pattern 200.

The substrate 100 may be, for example, bulk silicon or silicon-on-insulator (SOI). The substrate 100 may be a silicon substrate or may include other substances, for example, silicon germanium, indium antimonide, lead tellurium compound, indium arsenide, indium phosphide, gallium arsenide or gallium antimonide. Alternatively, the substrate 100 may have an epitaxial layer formed on the base substrate.

The first fin-type pattern F11 and the second fin-type pattern F12 may protrude from the top of the substrate 100. In an embodiment, the first fin-type pattern F11 and the second fin-type pattern F12 may have short sides and long sides, respectively. The first fin-type pattern F11 and the second fin-type pattern F12 extend in the long side direction and may be formed adjacent to each other. FIG. 1 illustrates a configuration in which the short sides of the first fin-type pattern F11 and the second fin-type pattern F12 extend along a first direction X1, and the long sides of the first fin-type pattern F11 and the second fin-type pattern F12 extend along a second direction Y1. That is, the first fin-type pattern F11 and the second fin-type pattern F12 may extend on the substrate 100 along the second direction Y1, respectively.

The first fin-type pattern F11 and the second fin-type pattern F12 may be a part of the substrate 100, and may include an epitaxial layer grown from the substrate 100. The first fin-type pattern F11 and the second fin-type pattern F12 may include, for example, silicon or germanium. In an embodiment, the first fin-type pattern F11 and the second fin-type pattern F12 may include a compound semiconductor, for example, an IV-IV group compound semiconductor or an III-V group compound semiconductor.

Specifically, the description will be given of a case where the first fin-type pattern F11 and the second fin-type pattern F12 include the group compound semiconductor as an example. The first fin-type pattern F11 and the second fin-type pattern F12 may be a binary compound or a ternary compound containing at least two of carbon (C), silicon (Si), germanium (Ge), and tin (Sn), or a compound obtained by doping the compounds with a group IV element. When the first fin-type pattern F11 and the second fin-type pattern F12 include group III-V compound semiconductors, the first fin-type pattern F11 and the second fin-type pattern F12 may include one of a binary compound, a ternary compound, or a quaternary compound formed by bonding at least one of aluminum (Al), gallium (Ga) and indium (In) as group III elements, and one of phosphorus (P), arsenic (As), and antimonyium (Sb) as group V elements. In the semiconductor device according to some embodiments, the first fin-type pattern F11 and the second fin-type pattern F12 will be described as a silicon fin-type pattern including silicon.

The field insulating film 110 may cover the side surface of the first fin-type pattern F11 and the side surface of the second fin-type pattern F12 on the substrate 100. For example, the field insulating film 110 may fill the space between the first fin-type pattern F11 and the second fin-type pattern F12.

In FIGS. 1 and 3, the upper surface of the field insulating film 110 is illustrated as having the same height as a partial upper surface of the first fin-type pattern F11 and a partial upper surface of the second fin-type pattern F12, but the present disclosure is not limited thereto. For example, the first fin-type pattern F11 and the second fin-type pattern F12 may protrude upward from the field insulating film 110.

The field insulating film 110 may include, for example, one of an oxide film, a nitride film, an oxynitride film, or a combination thereof. However, the present disclosure is not limited thereto.

The first gate structure 120 and the second gate structure 130 may be formed to intersect with the first fin-type pattern F12 and the second fin-type pattern F12 on the first fin-type pattern F11 and the second fin-type pattern F11. That is, the first gate structure 120 and the second gate structure 130 may extend on the substrate 100 along the first direction X1, respectively.

The first gate structure 120 may include a first gate insulating film 122, a first gate electrode 124, and a first gate spacer 126. Further, the second gate structure 130 may include a second gate insulating film 132, a second gate electrode 134, and a second gate spacer 136.

The first gate electrode 124 may include a metal layer. As illustrated, the first gate electrode 124 may be formed by laminating a first metal layer MG1 and a second metal layer MG2. Like the first gate electrode 124, the second gate electrode 134 may include a metal layer. In an embodiment, the second gate electrode 134 may be formed by laminating a third metal layer MG3 and a fourth metal layer MG4.

The first metal layer MG1 and the third metal layer MG3 may adjust the work function. The second metal layer MG2 and the fourth metal layer MG4 may fill the space formed by the first metal layer MG1 and the third metal layer MG3, respectively.

The first metal layer MG1 and the third metal layer MG3 may include, for example, at least one of TiN, TaN, TiC, TaC, TiAl, and TiAlC. Further, the second metal layer MG2 and the fourth metal layer MG4 may include, for example, at least one of W, Al, TiN, and Co. The first gate electrode 124 and the second gate electrode 134 may include silicon or silicon germanium according to an embodiment. The first gate electrode 124 and the second gate electrode 134 may be formed through, for example, a replacement process, but the present disclosure is not limited thereto.

The first gate insulating film 122 may be interposed between the first fin-type pattern F11 and the first gate electrode 124, and between the second fin-type pattern F12 and the first gate electrode 124. That is, the first gate insulating film 122 may be formed on the first fin-type pattern F11 and the second fin-type pattern F12 exposed by the field insulating film 110. Further, the first gate insulating film 122 may be interposed between the first gate electrode 124 and the field insulating film 110.

The second gate insulating film 132 may be interposed between the first fin-type pattern F11 and the second gate electrode 134, and between the second fin-type pattern F12 and the second gate electrode 134. That is, the second gate insulating film 132 may be formed on the first fin-type pattern F11 and the second fin-type pattern F12 exposed by the field insulating film 110. Further, the second gate insulating film 132 may be interposed between the second gate electrode 134 and the field insulating film 110.

The first gate insulating film 122 and the second gate insulating film 132 may include a dielectric substance having a dielectric constant higher than that of the silicon oxide film. For example, each of the first gate insulating film 122 and the second gate insulating film 132 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof, but the present disclosure is not limited thereto.

The first gate spacer 126 may be formed on the sidewall of the first gate electrode 124. Also, the second gate spacer 136 may be formed on the sidewall of the second gate electrode 134.

The first gate spacer 126 and the second gate spacer 136 are illustrated as a single film, but the present disclosure is not limited thereto. For example, each of the first gate spacer 126 and the second gate spacer 136 may be formed of multi-films.

The first gate spacer 126 and the second gate spacer 136 may be include, for example, silicon nitride (SiN), silicon oxynitride (SiON), silicon oxide ($SiO_2$), silicon oxycarbonitride (SiOCN) or a combination thereof.

The shared epitaxial pattern 200 is formed on the first fin-type pattern F11 and the second fin-type pattern P12, and may connect the first fin-type pattern F11 and the second fin-type pattern F12. In an embodiment, the shared epitaxial pattern 200 may be formed on the first fin-type pattern F11 and the second fin-type pattern F12 on both side surfaces of the first gate structure 120 and both side surfaces of the second gate structure 130. In an embodiment, a part of the shared epitaxial pattern 200 may contact with the first fin-type pattern F11, and the other part of the shared epitaxial pattern 200 may contact with the second fin-type pattern F12.

In an embodiment, the shared epitaxial pattern 200 may be electrically insulated from the first gate electrode 124 and the second gate electrode 134 by the first gate spacer 126 and the second gate spacer 136. The shared epitaxial pattern 200 may function as the source/drain of the transistor including the first gate electrode 124 or the transistor including the second gate electrode 134.

In some embodiments, the shared epitaxial pattern 200 may be an elevated source/drain. That is, the uppermost part of the shared epitaxial pattern 200 may protrude upward from the upper surfaces of the first fin-type pattern F11 and the second fin-type pattern F12. Also, in some embodiments, the shared epitaxial pattern 200 formed between the first gate structure 120 and the second gate structure 130 may be a source/drain common to the first gate structure 120 and the second gate structure 130.

The shared epitaxial pattern 200 may be formed of multi-layers. In an embodiment, the shared epitaxial pattern 200 may include a first seed layer 205, a first epitaxial layer 210, a second seed layer 215, a second epitaxial layer 220, a connecting epitaxial layer 230, and a capping epitaxial layer 240.

In an embodiment, the upper surface of the shared epitaxial pattern 200 may include a plurality of slopes having the inclination with respect to the upper surface of the substrate 100. In an embodiment, the upper surface of the shared epitaxial pattern 200 may include a first shared slope 201, a second shared slope 202, a third shared slope 203, and a fourth shared slope 204.

The first seed layer 205 may be formed on the first fin-type pattern F11. For example, the first seed layer 205 may be formed by epitaxial growth from the first fin-type pattern F11.

The second seed layer 215 may be formed on the second fin-type pattern F12. For example, the second seed layer 215 may be formed by the epitaxial growth from the second fin-type pattern F12.

The first seed layer 205 and the second seed layer 215 may serve as a seed layer for growing the shared epitaxial pattern 200. However, in some embodiments, the first seed layer 205 and the second seed layer 215 may also be omitted.

The first epitaxial layer 210 may be formed on the first fin-type pattern F11. Specifically, the first trench TR1 may be formed in the first fin-type pattern F11 on both side surfaces of the gate structure. For example, as illustrated in FIG. 4, the first trench TR1 may be formed in the first fin-type pattern F11 between the first gate structure 120 and the second gate structure 130. At this time, the first epitaxial layer 210 may be formed to fill the first trench TR1. In an embodiment, the first epitaxial layer 210 may also be formed on the first fin-type pattern F11 in which the first trench TR1 is not formed.

The cross section of the first epitaxial layer 210 may have a diamond shape (or a pentagonal shape or a hexagonal shape). For example, as illustrated in FIG. 3, the upper surface of the first epitaxial layer 210 may include a first upper slope 211 and a second upper slope 214 having the inclination with respect to the upper surface of the substrate 100. In an embodiment, the lower surface of the first epitaxial layer 210 may include a first lower slope 212 and a second lower slope 213 having the inclination with respect to the upper surface of the substrate 100. The first upper slope 211 may face the second lower slope 213, and the second upper slope 214 may face the first lower slope 212.

The first upper slope 211 may constitute a part of the upper surface of the shared epitaxial pattern 200. The first lower slope 212 and the second lower slope 213 may constitute a part of the lower surface of the shared epitaxial pattern 200.

In some embodiments, the first upper slope 211, the second upper slope 214, the first lower slope 212, and the second lower slope 213 may have a {111} crystal surface.

The second epitaxial layer 220 may be formed on the second fin-type pattern F12. In an embodiment, the second trench TR2 may be formed inside the second fin-type pattern F12 on both side surfaces of the gate structure. At this time, the second epitaxial layer 220 may be formed to fill the second trench TR2. In an embodiment, the second epitaxial layer 220 may also be formed on the second fin-type pattern F12 in which the second trench TR2 is not formed.

As with the first epitaxial layer 210, the cross section of the second epitaxial layer 220 may have a diamond shape (or a pentagonal shape or a hexagonal shape). For example, as illustrated in FIG. 3, the upper surface of the second epitaxial layer 220 may include a third upper slope 221 and a fourth upper slope 224 having the inclination with respect to the upper surface of the substrate 100. The lower surface of the second epitaxial layer 220 may include a third lower slope 222 and a fourth lower slope 223 having the inclination with respect to the upper surface of the substrate 100. The third upper slope 221 may face the fourth lower slope 223, and the fourth upper slope 224 may face the third lower slope 222.

In some embodiments, the third upper slope 221, the fourth upper slope 224, the third lower slope 222, and the fourth lower slope 223 may have a {111} crystal surface.

The third upper slope 221 may constitute a part of the upper surface of the shared epitaxial pattern 200. The third lower slope 222 and the fourth lower slope 22.3 may constitute a part of the lower surface of the shared epitaxial pattern 200.

Each of the first epitaxial layer 210 and the second epitaxial layer 220 is illustrated as a single layer, but the present disclosure is not limited thereto. For example, each of the first epitaxial layer 210 and the second epitaxial layer 220 may be formed of multi-layers.

The connecting epitaxial layer 230 may be interposed between the first epitaxial layer 210 and the second epitaxial layer 220 to connect the first epitaxial layer 210 and the second epitaxial layer 220. Specifically, the connecting epitaxial layer 230 may be formed on the second upper slope 214 of the first epitaxial layer 210 and the fourth upper slope 224 of the second epitaxial layer 220. For example, the connecting epitaxial layer 230 may cover at least a part of the second upper slope 214 and at least a part of the fourth upper slope 224.

In an embodiment, the connecting epitaxial layer 230 may not be formed on the first upper slope 211 and the third upper slope 221. Therefore, the first upper slope 211 and the third upper slope 221 may not contact with the connecting epitaxial layer 230.

In FIGS. 1 and 3, the upper surface of the connecting epitaxial layer 230 is illustrated as being lower than the uppermost part of the first epitaxial layer 210 and the uppermost part of the second epitaxial layer 220. That is, the connecting epitaxial layer 230 is illustrated to expose a part of the second upper slope 214 and a part of the fourth upper slope 224, but the present disclosure is not limited thereto. For example, in some embodiments, the height from the substrate 100 to the upper surface of the connecting epitaxial layer 230 may be substantially the same as the height from the substrate 100 to the uppermost parts of the first epitaxial layer 210 and the second epitaxial layer 220. That is, in some embodiments, the connecting epitaxial layer 230 may completely cover the second upper slope 214 and the fourth upper slope 224.

The lower surface of the connecting epitaxial layer 230 may be lower than the second upper slope 214 and the fourth upper slope 224. That is, the connecting epitaxial layer 230 may cover a part of the second lower slope 213 and a part of the fourth lower slope 223. However, the present disclosure is not limited thereto, and the lower surface of the connecting epitaxial layer 230 may not extend below the second upper slope 214 and the fourth upper slope 224. That is, in some embodiments, the connecting epitaxial layer 230 may not cover the second lower slope 213 and the fourth lower slope 223.

In an embodiment, the lower surface of the connecting epitaxial layer 230 may be spaced apart from the field insulating film 110. For example, the connecting epitaxial layer 230 may not directly contact with the field insulating film 110. As a result, the lower surface of the connecting epitaxial layer 230 may form a part of the lower surface of the shared epitaxial pattern 200.

The connecting epitaxial layer 230 is illustrated as a single layer, but the present disclosure is not limited thereto. For example, the connecting epitaxial layer 230 may be formed of multi-layers.

The capping epitaxial layer 240 may be formed on the first epitaxial layer 210, the second epitaxial layer 220, and the connecting epitaxial layer 230. The capping epitaxial layer 240 may be formed by epitaxial growth from the first epitaxial layer 210, the second epitaxial layer 220 and the connecting epitaxial layer 230. At this time, the uppermost part of the capping epitaxial layer 240 may be higher than the uppermost part of the first epitaxial layer 210, the uppermost part of the second epitaxial layer 220, and the uppermost part of the connecting epitaxial layer 230.

In an embodiment, the upper surface of the capping epitaxial layer 240 may include a first capping slope 241, a second capping slope 242, a third capping slope 243, and a fourth capping slope 244.

The first capping slope 241 may extend from the upper surface of the first epitaxial layer 210 which is not in contact with the connecting epitaxial layer 230. Specifically, as illustrated in FIG. 3, the first capping slope 241 may be formed to extend from the first upper slope 211. Also, the second capping slope 242 may extend from the upper surface of the second epitaxial layer 220 which is not in contact with the connecting epitaxial layer 230. As illustrated in FIG. 3, the second capping slope 242 may be formed to extend from the third upper slope 221.

Therefore, the first capping slope 241 and the second capping slope 242 may have the inclination with respect to the upper surface of the substrate 100. In some embodiments, when the first upper slope 211 and the third upper slope 221 have a {111} crystal surface, the first capping slope 241 and the second capping slope 242 may also have a {111} crystal surface.

The first upper slope 211 and the first capping slope 241 may form a first shared slope 201 which is one of the upper surfaces of the shared epitaxial pattern 200. Also, the third upper slope 221 and the second capping slope 242 may form a second shared slope 202 which is one of other upper surfaces of the shared epitaxial pattern 200.

In the shared epitaxial pattern 200 formed between the first gate structure 120 and the second gate structure 130, each of the first shared slopes 201 and the second shared slopes 202 may connect the first gate structure 120 and the second gate structure 130.

The third capping slope 243 may be connected to the first capping slope 241 and the second capping slope 242. That is, as illustrated in FIG. 1, the third capping slope 243 may connect the first capping slope 241 and the second capping slope 242.

Figure 5:
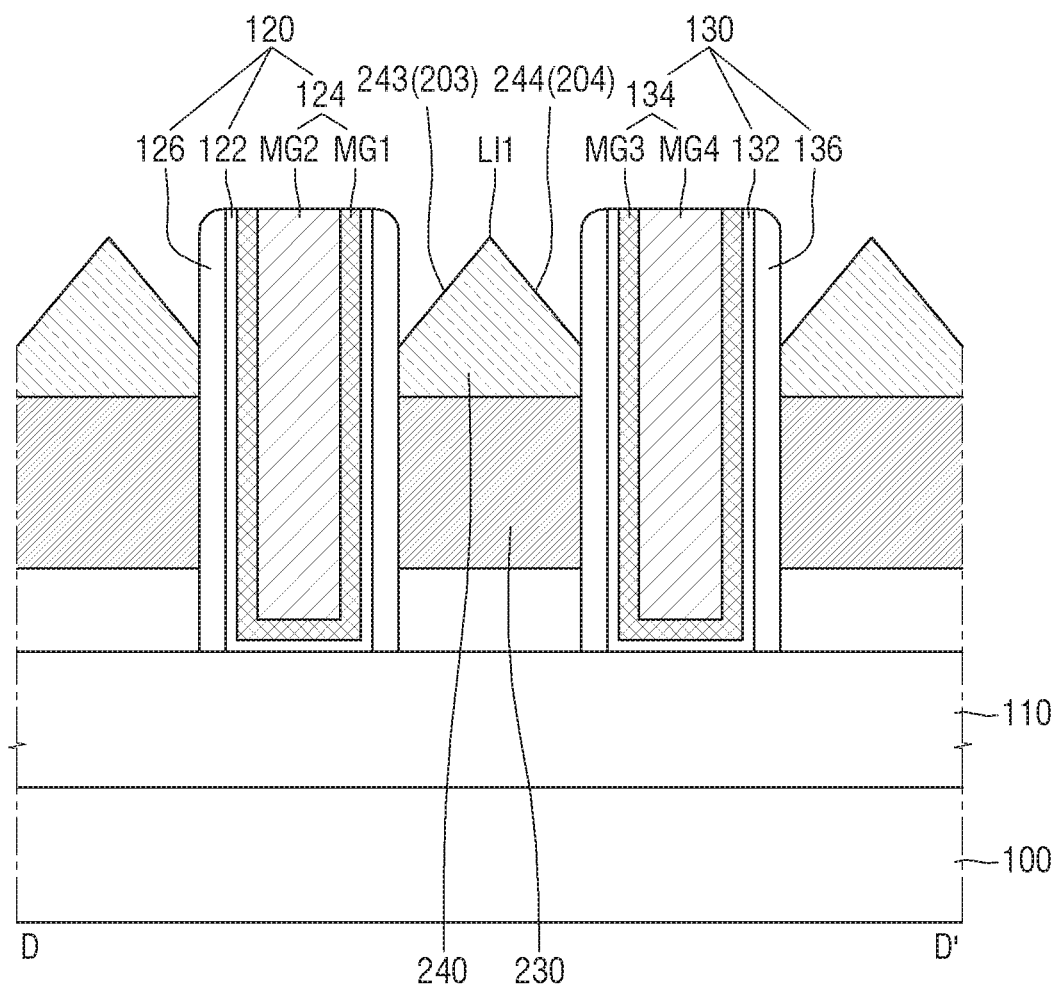
FIG. 5 is a cross-sectional view taken along the line D-D' of FIG. 1.

Further, the third capping slope 243 is disposed above the upper surface of the connecting epitaxial layer 230 and contacts one gate structure, and may have an inclination with respect to the upper surface of the substrate 100. For example, as illustrated in FIG. 5, the third capping slope 243 is disposed above the upper surface of the connecting epitaxial layer 230 and contacts the first gate structure 120, and may have an inclination with respect to the upper surface of the substrate 100.

The fourth capping slope 244 may be connected to the first capping slope 241 and the second capping slope 242. That is, as illustrated in FIG. 1, the fourth capping slope 244 may connect the first capping slope 241 and the second capping slope 242.

Also, the fourth capping slope 244 is disposed above the upper surface of the connecting epitaxial layer 230 and contacts the other gate structure, and may have an inclination with respect to the upper surface of the substrate 100. For example, as illustrated in FIG. 5, the fourth capping slope 244 is disposed above the upper surface of the connecting epitaxial layer 230 and contacts the second gate structure 130, and may have an inclination with respect to the upper surface of the substrate 100.

Thus, the third capping slope 243 may constitute a third shared slope 203 which is one of other upper surfaces of the shared epitaxial pattern 200. The fourth capping slope 244 may constitute a fourth shared slope 204 which is one of other upper surfaces of the shared epitaxial pattern 200.

In some embodiments, the third capping slope 243 and the fourth capping slope 244 may have a {111} crystal surface.

Also, in some embodiments, the third shared slope 203 and the fourth shared slope 204 may meet between the gate structures. For example, the third shared slope 203 and the fourth shared slope 204 may meet between the first gate structure 120 and the second gate structure 130 to form a first intersection line LI1. As a result, as illustrated in FIG. 1, the third shared slope 203 and the fourth shared slope 204 may have a trapezoidal shape. Further, the uppermost part of the third shared slope 203 and the uppermost part of the fourth shared slope 204 may be formed at the first intersection line LI1.

As illustrated in FIGS. 1 and 3, when the third shared slope 203 and the fourth shared slope 204 meet to form the first intersection line LI1, the first intersection line LI1 may extend along the first direction X1. That is, the third shared slope 203 may connect the first shared slope 201 and the second shared slope 202. Similarly, the fourth shared slope 204 may connect the first shared slope 201 and the second shared slope 202. As a result, as illustrated in FIG. 1, the first shared slope 201 and the second shared slope 202 may have a pentagonal shape. Also, the uppermost part of the first shared slope 201 and the uppermost part of the second shared slope 202 may be connected to each other by the first intersection line LI1.

Since the first shared slope 201 is formed to extend upward from the first upper slope 211, the uppermost part of the shared epitaxial pattern 200 is higher than the uppermost part of the first epitaxial layer 210. Since the second shared slope 202 is formed to extend upward from the third upper slope 221, the uppermost part of the shared epitaxial pattern 200 is higher than the uppermost part of the second epitaxial layer 220. Since the third shared slope 203 and the fourth shared slope 204 is formed to extend upward from the connecting epitaxial layer 230, the uppermost part of the shared epitaxial pattern 200 is higher than the uppermost part of the connecting epitaxial layer 230. As a result, the uppermost part of the shared epitaxial pattern 200 may be formed to be higher than the uppermost part of the first epitaxial layer 210, the uppermost part of the second epitaxial layer 220, and the uppermost part of the connecting epitaxial layer 230.

Although the capping epitaxial layer 240 is illustrated as a single layer, the present disclosure is not limited thereto. For example, the capping epitaxial layer 240 may be formed of multi-layers.

When the semiconductor device according to some embodiments is a PMOS transistor, the shared epitaxial pattern 200 may include impurities for preventing diffusion of the p-type impurity or the p-type impurity. For example, the shared epitaxial pattern 200 may include at least one of B, C, In, Ga, and Al or combinations thereof.

In addition, when the semiconductor device according to some embodiments is a PMOS transistor, the shared epitaxial pattern 200 may include a compressive stress substance. For example, when the first fin-type pattern F11 and the second fin-type pattern F12 are Si, the shared epitaxial pattern 200 may include a substance having a larger lattice constant than Si, and may include, for example, SiGe. The compressive stress substance may apply a compressive stress to the first fin-type pattern F11 and the second fin-type pattern F12, thereby improving mobility of the carrier in the channel region.

Alternatively, when the semiconductor device according to some embodiments is an NMOS transistor, the shared epitaxial pattern 200 may contain n-type impurities or impurities for preventing diffusion of the n-type impurities. For example, the shared epitaxial pattern 200 may include at least one of Sb, As or a combination thereof.

When the semiconductor device according to some embodiments is an NMOS transistor, the shared epitaxial pattern 200 may include a tensile stress substance. For example, when the first fin-type pattern F11 and the second fin-type pattern F12 are Si, the shared epitaxial pattern 200 may include a substance having a smaller lattice constant than Si, and may include, for example, SiC. The tensile stress substance may apply tensile stress to the first fin-type pattern F11 and the second fin-type pattern F12, thereby improving mobility of the carrier in the channel region. However, in some embodiments, the shared epitaxial pattern 200 may not include a tensile stress substance.

In some embodiments, the first seed layer 205, the first epitaxial layer 210, the second seed layer 215, the second epitaxial layer 220, the connecting epitaxial layer 230, and the capping epitaxial layer 240 may contain first substances of different concentration, respectively. For example, when the semiconductor device according to some embodiments is a PMOS transistor, the first seed layer 205 and the second seed layer 215 may include a first substance, which is a compressive stress substance, at a first concentration, When the shared epitaxial pattern 200 contains Si, the first substance may be, for example, Ge.

At this time, the first epitaxial layer 210 and the second epitaxial layer 220 may include a first substance having a second concentration different from the first concentration. For example, the first concentration may be 10% to 30%, and the second concentration may be 40% to 65%. Also, the connecting epitaxial layer 230 may contain a first substance of a third concentration different from the second concentration. For example, the second concentration may be 40% to 65%, and the third concentration may be 10% to 30%. The capping epitaxial layer 240 may contain a first substance of a fourth concentration different from the second concentration or the third concentration. For example, the second concentration may be 40% to 65%, and the fourth concentration may be 10% to 30%.

As the concentration of the first substance increases, the compressive stress applied to the channel region increases. Accordingly, the first epitaxial layer 210 and the second epitaxial layer 220 including the first substance having the second concentration higher than the first concentration or the third concentration may serve to improve mobility of the carrier. Further, as the concentration of the first substance increases, the epitaxial layer can be easily etched. Therefore, the connecting epitaxial layer 230 including the first substance having the third concentration lower than the second concentration, or the capping epitaxial layer 240 including the first substance having the fourth concentration lower than the second concentration may adjust the etching amount of the first epitaxial layer 210 or the second epitaxial layer 220 from the etching process.

However, in some embodiments, at least some of the first to fourth concentrations may be the same. In the present specification, the term "the same" is the meaning of including a fine difference which may occur due to a process margin or the like, as well as completely the same thing.

The shared epitaxial pattern 200 may enlarge the contact area with the contact electrically connected to the shared epitaxial pattern 200. The reason is that the contact formed on the shared epitaxial pattern 200 may also come into contact with the connecting epitaxial layer 230 and the capping epitaxial layer 240 as well as the first epitaxial layer 210 and the second epitaxial layer 220. Therefore, the contact resistance is reduced, and the operating characteristics of the semiconductor device may be improved.

Further, since the uppermost part of the shared epitaxial pattern 200 may be formed to be high, it is possible to prevent a problem such as an occurrence of a short circuit due to excessive etching of the epitaxial pattern in the process of forming the contact. Therefore, the reliability of the product of the semiconductor device may be improved.

Figure 6:
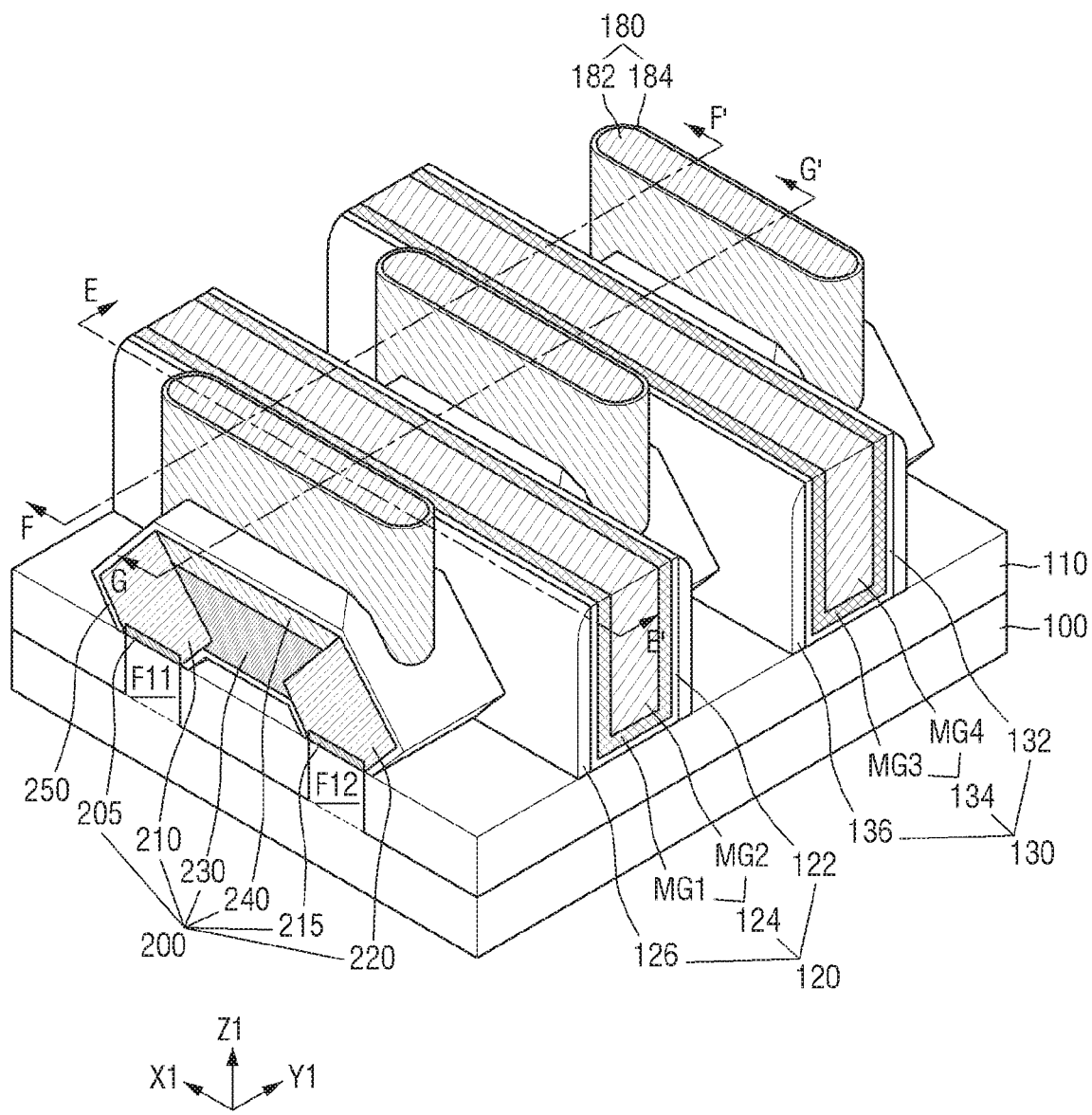
FIG. 6 is a perspective view illustrating a semiconductor device according to some embodiments of the present inventive concept.
Figure 7:
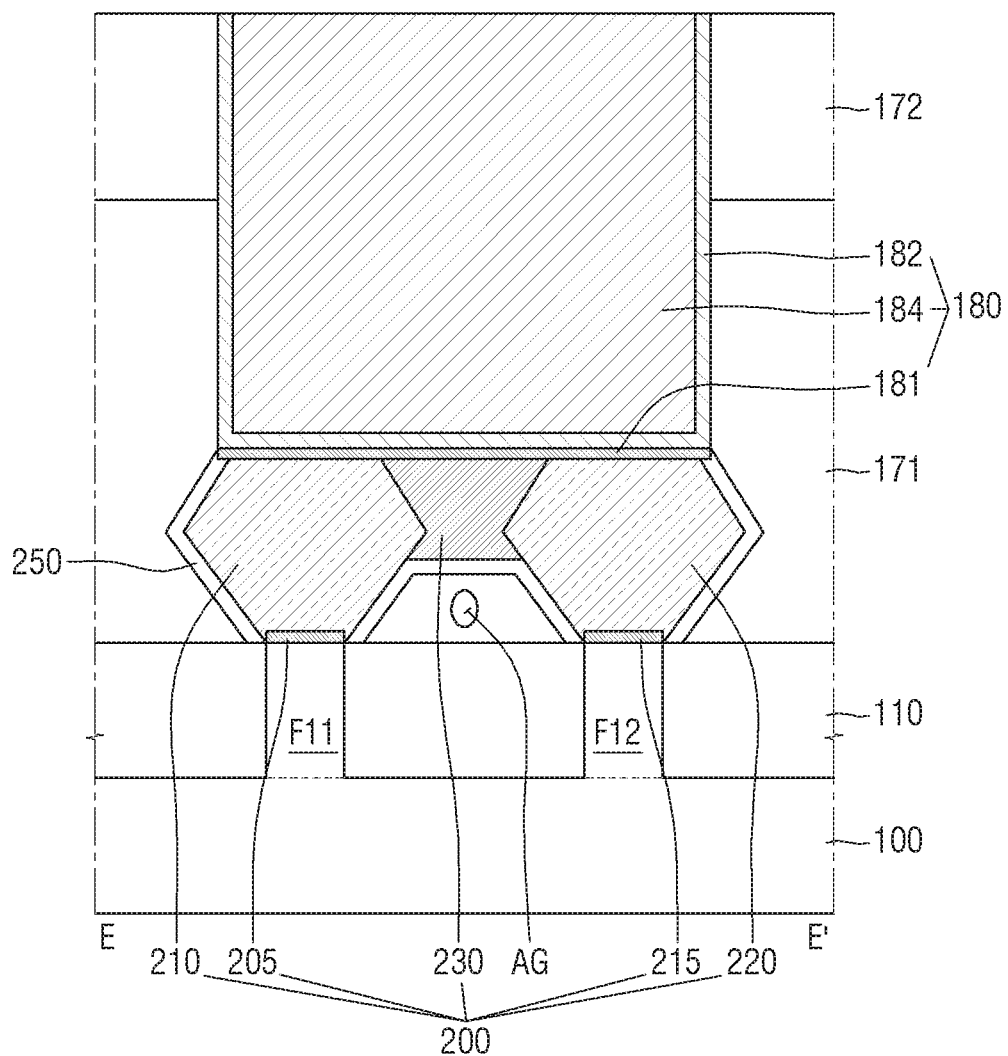
FIG. 7 is a cross-sectional view taken along the line E-E' of FIG. 6.
Figure 8:
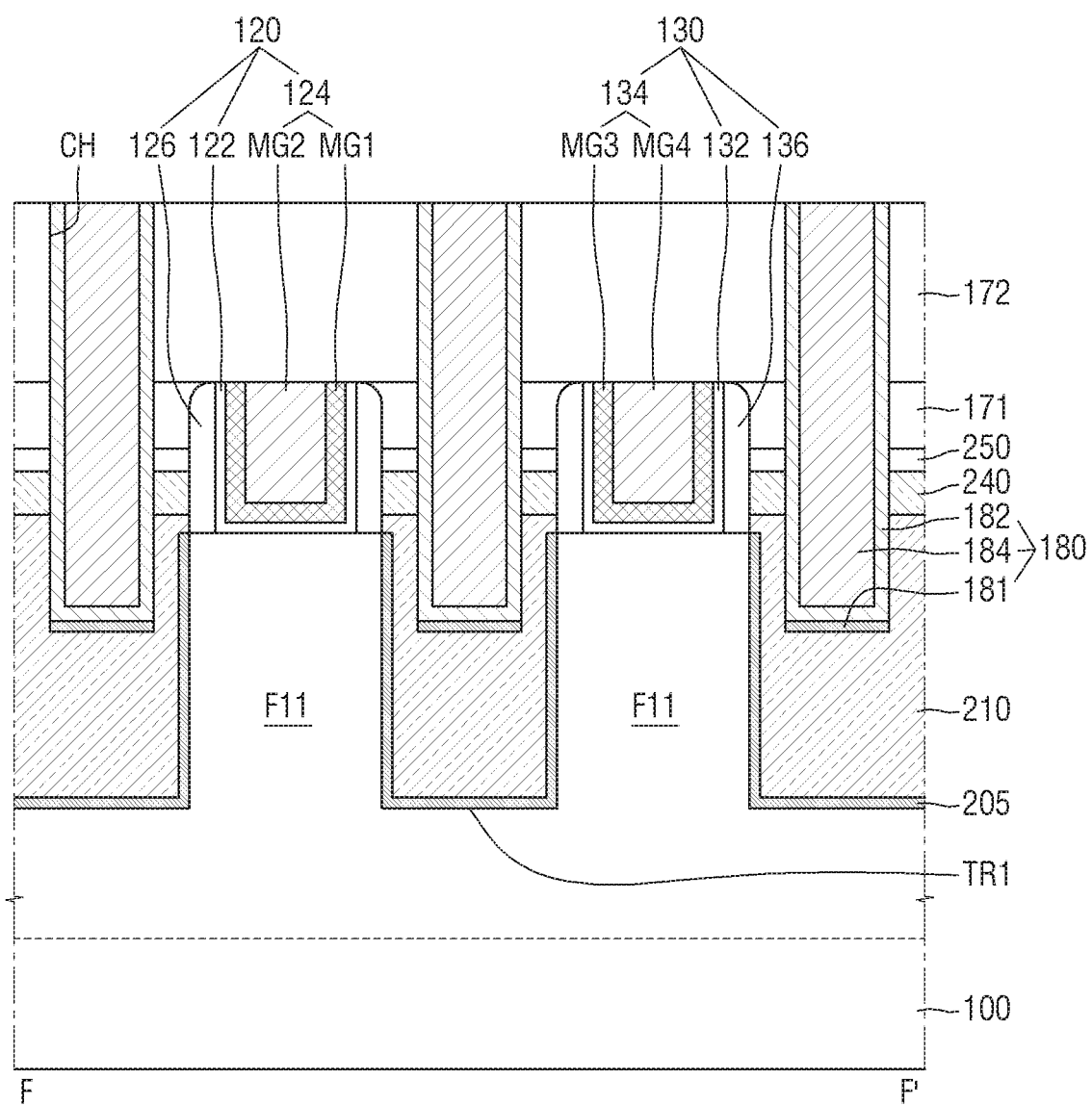
FIG. 8 is a cross-sectional view taken along the line F-F' of FIG. 6.
Figure 9:
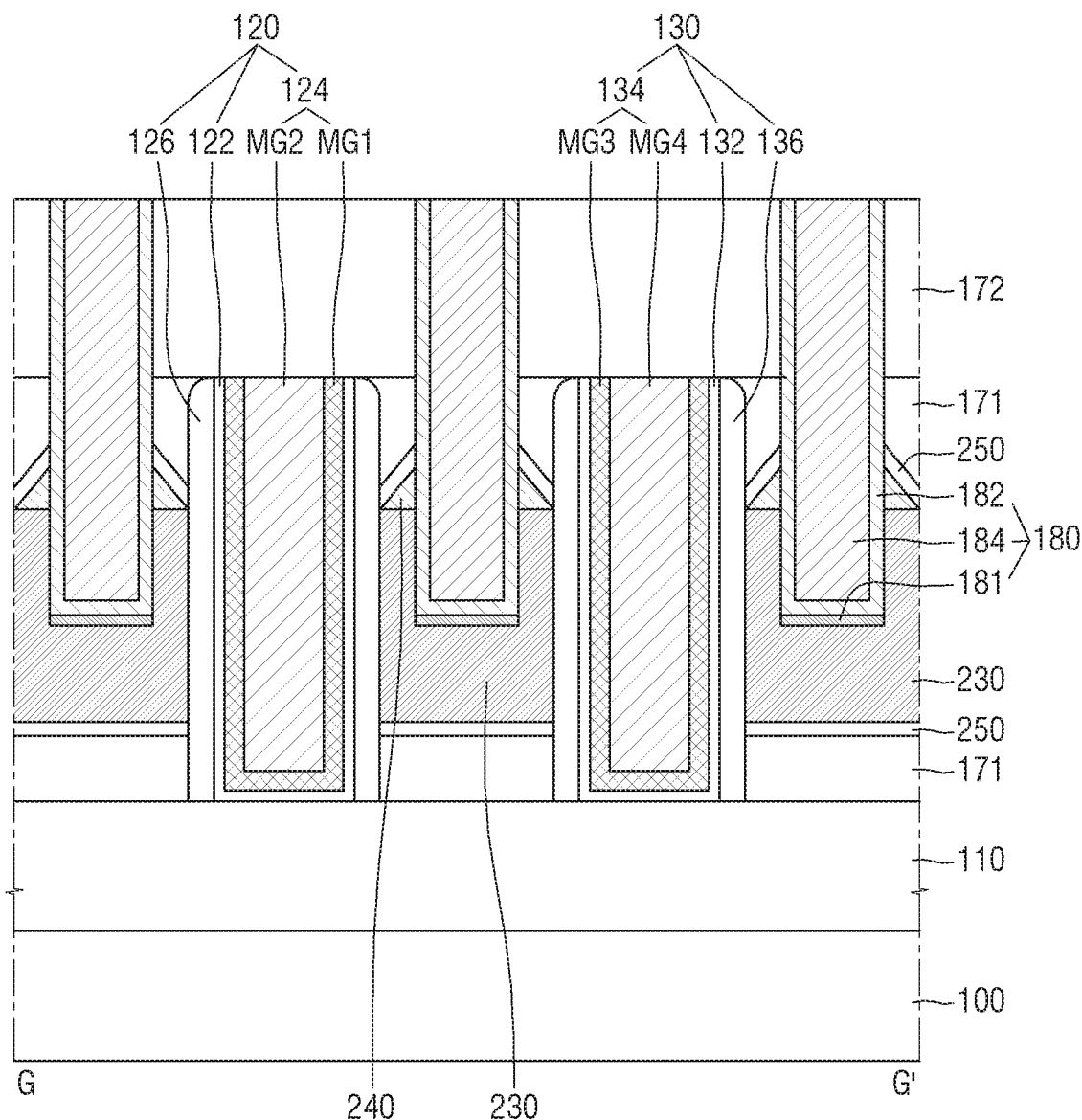
FIG. 9 is a cross-sectional view taken along the line G-G' of FIG. 6.

FIG. 6 is a perspective view illustrating a semiconductor device according to some embodiments of the present inventive concept. FIG. 7 is a cross-sectional view taken along the line E-E' of FIG. 6. FIG. 8 is a cross-sectional view taken along the line F-F' of FIG. 6. FIG. 9 is a cross-sectional view taken along the line G-G' of FIG. 6. For the sake of convenience of explanation, duplicated portions of those described with reference to FIGS. 1 to 5 will be briefly described or omitted.

Referring to FIGS. 6 to 9, the semiconductor device according to some embodiments further includes a protective layer 250, a contact 180, a first interlayer insulating film 171, and a second interlayer insulating film 172. For convenience of explanation, FIG. 6 does not illustrate the first interlayer insulating film 171 and the second interlayer insulating film 172.

The protective layer 250 may be formed to cover the shared epitaxial pattern 200. For example, the protective layer 250 may conformally cover the shared epitaxial pattern 200.

The protective layer 250 may not contain the first substance. For example, when a semiconductor device according to some embodiments is a PMOS transistor, the protective layer 250 may not contain Ge which is a compressive stress substance. As the concentration of the first substance increases, the protective layer 250 can be more easily etched. Thus, in the process of forming the contact 180 on the shared epitaxial pattern 200, the protective layer 250 may protect the shared epitaxial pattern 200 or adjust the etching amount of the shared epitaxial pattern 200.

The contact 180 may include a silicide film 181, a first conductive film 182, and a second conductive film 184. The contact 180 may electrically connect the shared epitaxial pattern 200 to the wiring.

The silicide film 181 is formed on the lower surface of the contact 180 and may come into contact with the shared epitaxial pattern 200. The silicide film 181 may include, for example, Pt, Ni, Co, etc., but the present disclosure is not limited thereto.

The first conductive film 182 may be formed on the suicide film 181 along the sidewall and the lower surface of the contact hole CH. The second conductive film 184 may be formed to fill the remaining portions of the contact hole CH. Although the contact hole CH is illustrated to penetrate a part of the shared epitaxial pattern 200, the present disclosure is not limited thereto. For example, the lower surface of the contact hole CH may be formed along the upper surface of the shared epitaxial pattern 200 or the upper surface of the protective layer 250.

The first conductive film 182 may contain, for example, Ti or TiN, and the second conductive film 184 may contain, for example, W, Al, Cu or the like, but the invention is not limited thereto.

The first interlayer insulating film 171 and the second interlayer insulating film 172 may be sequentially laminated on the field insulating film 110. For example, the first interlayer insulating film 171 may cover the protective layer 250 and may cover a part of the sidewall of the contact 180. For example, the second interlayer insulating film 172 may cover the remaining sidewalls of the contact 180.

As illustrated in FIG. 7, the first interlayer insulating filth 171 may be formed to fill the surrounding space of the shared epitaxial pattern 200 or the protective layer 250. However, in some embodiments, the first interlayer insulating film 171 may not completely fill the lower part of the lower surface of the shared epitaxial pattern 200. For example, the first interlayer insulating film 171 may not completely fill the space of the lower surface of the connecting epitaxial layer 230. Therefore, an air gap AG may be formed below the connecting epitaxial layer 230.

As illustrated in FIG. 8, the upper surface of the first interlayer insulating film 171 may be disposed on the same plane as the upper surface of the first gate structure 120 and the upper surface of the second gate structure 130. The second interlayer insulating film 172 may be formed to cover the first gate structure 120 and the second gate structure 130. The first interlayer insulating film 171 and the second interlayer insulating film 172. may include, for example, at least one of an oxide film, a nitride film, and an oxynitride film, but the present disclosure is not limited thereto.

Figure 10:
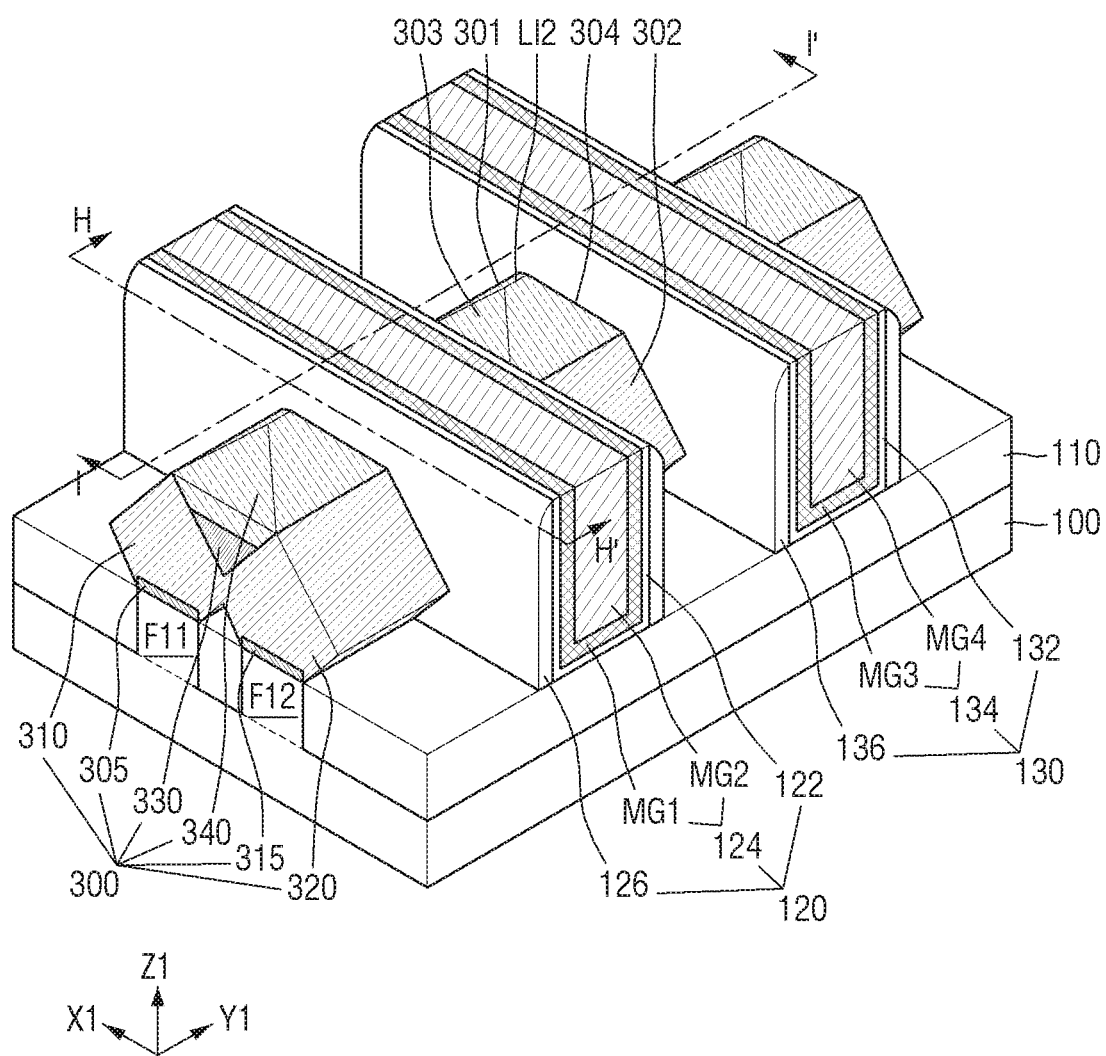
FIG. 10 is a perspective view illustrating a semiconductor device according to some embodiments of the present inventive concept.
Figure 11:
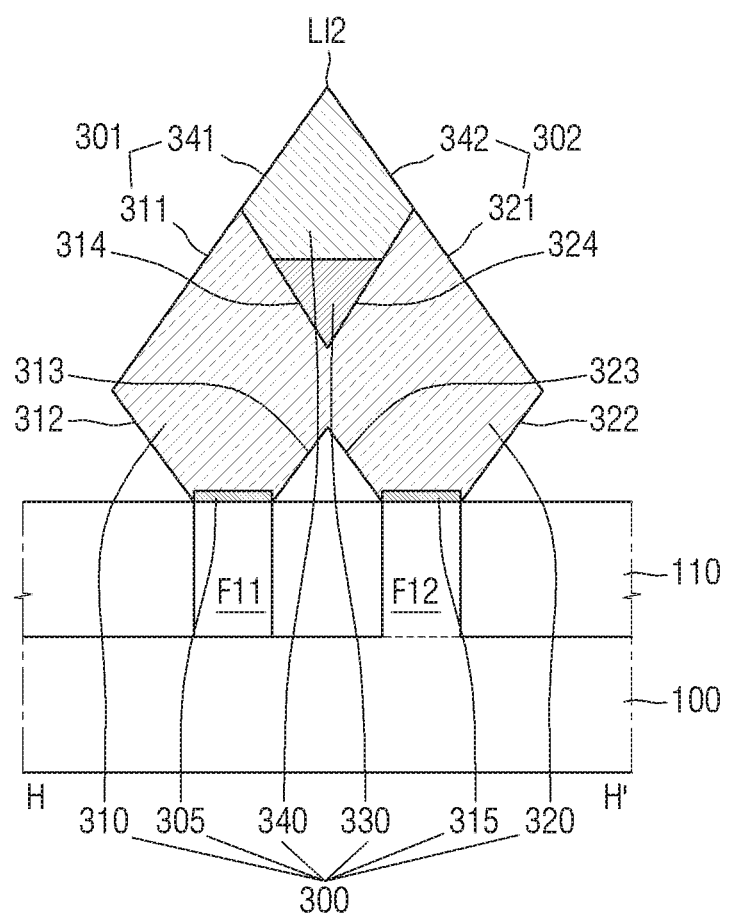
FIG. 11 is a cross-sectional view taken along the line H-H' of FIG. 10.
Figure 12:
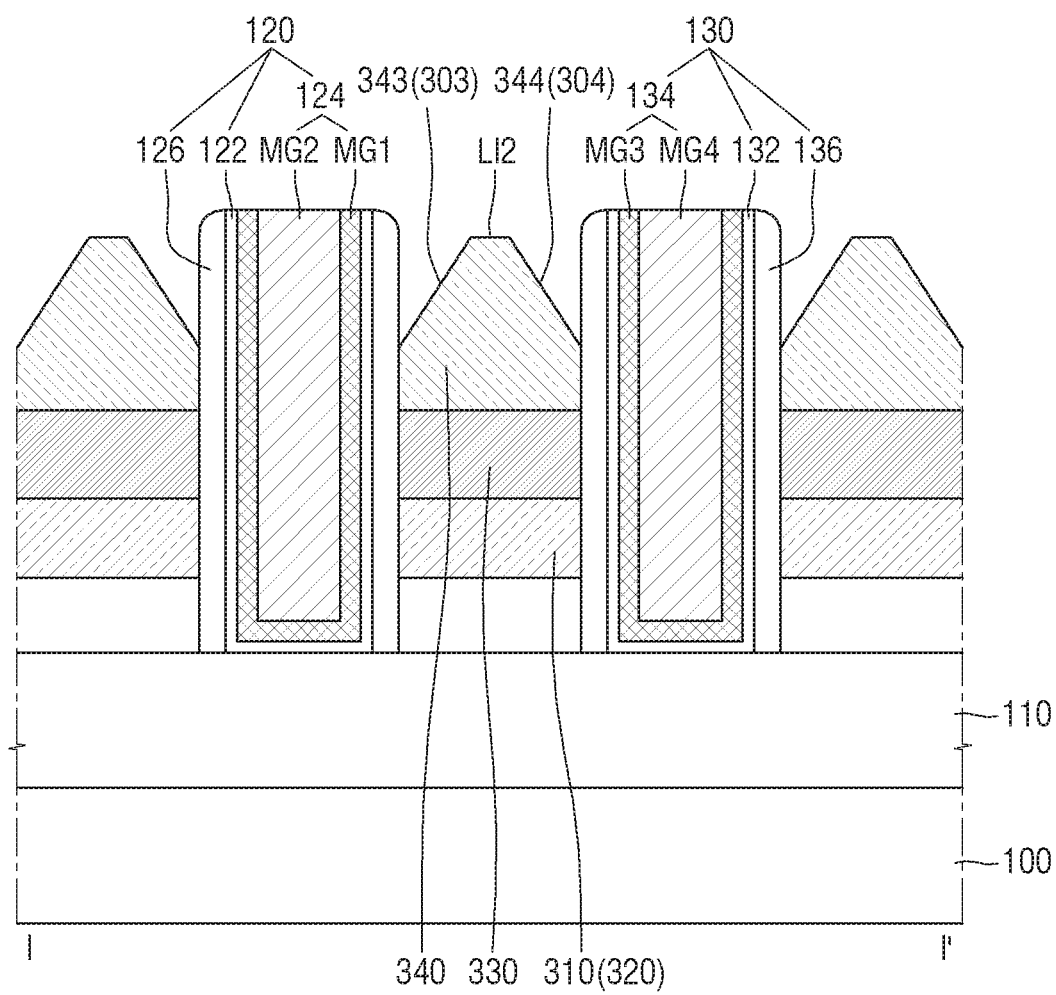
FIG. 12 is a cross-sectional view taken along the line I-I' of FIG. 10.

FIG. 10 is a perspective view illustrating a semiconductor device according to some embodiments of the present inventive concept. FIG. 11 is a cross-sectional view taken along the line H-H' of FIG. 10. FIG. 12 is a cross-sectional view taken along the line I-I' of FIG. 10. For the sake of convenience of explanation, duplicated portions of those described with reference to FIGS. 1 to 5 will be briefly described or omitted.

Referring to FIGS. 10 to 12, a semiconductor device according to some embodiments includes a shared epitaxial pattern 300.

The shared epitaxial pattern 300 includes a first seed layer 305, a first epitaxial layer 310, a second seed layer 315, a second epitaxial layer 320, a connecting epitaxial layer 330, and a capping epitaxial layer 340.

Also, the upper surface of the shared epitaxial pattern 300 may include a first shared slope 301, a second shared slope 302, a third shared slope 303, and a fourth shared slope 304.

As illustrated in FIG. 11, the first upper slope 311 and the first capping slope 341 may form the first shared slope 301 which is one of the upper surfaces of the shared epitaxial pattern 300. Also, the third upper slope 321 and the second capping slope 342 may form the second shared slope 302 which is one of other upper surfaces of the shared epitaxial pattern 300.

As illustrated in FIG. 12, the third capping slope 343 may form a third shared slope 303 which is one of other upper surfaces of the shared epitaxial pattern 300. Further, the fourth capping slope 344 may form a fourth shared slope 304 which is one of other upper surfaces of the shared epitaxial pattern 300.

In FIGS. 10 and 12, the first epitaxial layer 310 and the second epitaxial layer 320 are illustrated in the state of being in contact with each other. For example, when the distance between the first fin-type pattern F11 and the second fin-type pattern F12 approaches, the first epitaxial layer 310 and the second epitaxial layer 320 may be in contact with each other. However, the present disclosure is not limited thereto, and the first epitaxial layer 310 and the second epitaxial layer 320 may not be in contact with each other.

The connecting epitaxial layer 330 may be formed on the first epitaxial layer 310 and the second epitaxial layer 320. When the first epitaxial layer 310 and the second epitaxial layer 320 are in contact with each other, the connecting epitaxial layer 330 may be isolated by the second upper slope 314 and the fourth upper slope 324. That is, the lower surface of the connecting epitaxial layer 330 may not be in contact with the second lower slope 313 and the fourth lower slope 323.

In some embodiments, the first shared slope 301 and the second shared slope 302 may intersect with each other between the gate structures. For example, the first shared slope 301 and the second shared slope 302 may meet between the first gate structure 120 and the second gate structure 130 to form a second intersection line LI2. Accordingly, as illustrated in FIG. 10, the first shared slope 301 and the second shared slope 302 may have a hexagonal shape. Further, the uppermost part of the first shared slope 301 and the uppermost part of the second shared slope 302 may be formed on the second intersection line LI2.

As illustrated in FIGS. 10 and 11, when the first shared slope 301 and the second shared slope 302 form the second intersection line LI2, the second intersection line LI2 may extend along the second direction Y1. That is, the first shared slope 301 may connect the third shared slope 303 and the fourth shared slope 304. Similarly, the second shared slope 302 may connect the third shared slope 303 and the fourth shared slope 304. As a result, as illustrated in FIG. 10, the third shared slope 303 and the fourth shared slope 304 may have a triangular shape. Also, the uppermost part of the third shared slope 303 and the uppermost part of the fourth shared slope 304 may be connected to each other by the second intersection line LI2.

Figure 13:
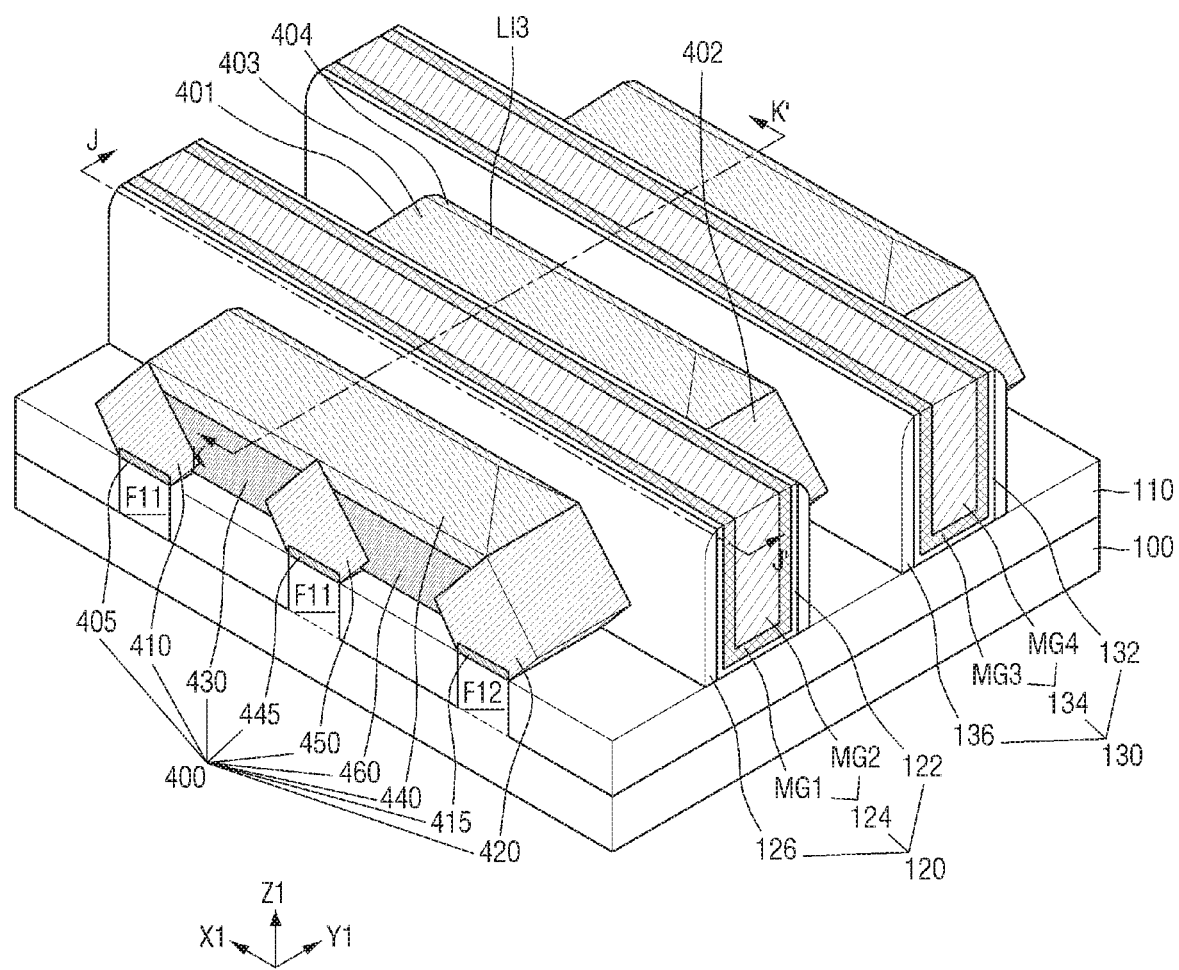
FIG. 13 is a perspective view illustrating a semiconductor device according to some embodiments of the present inventive concept.
Figure 14:
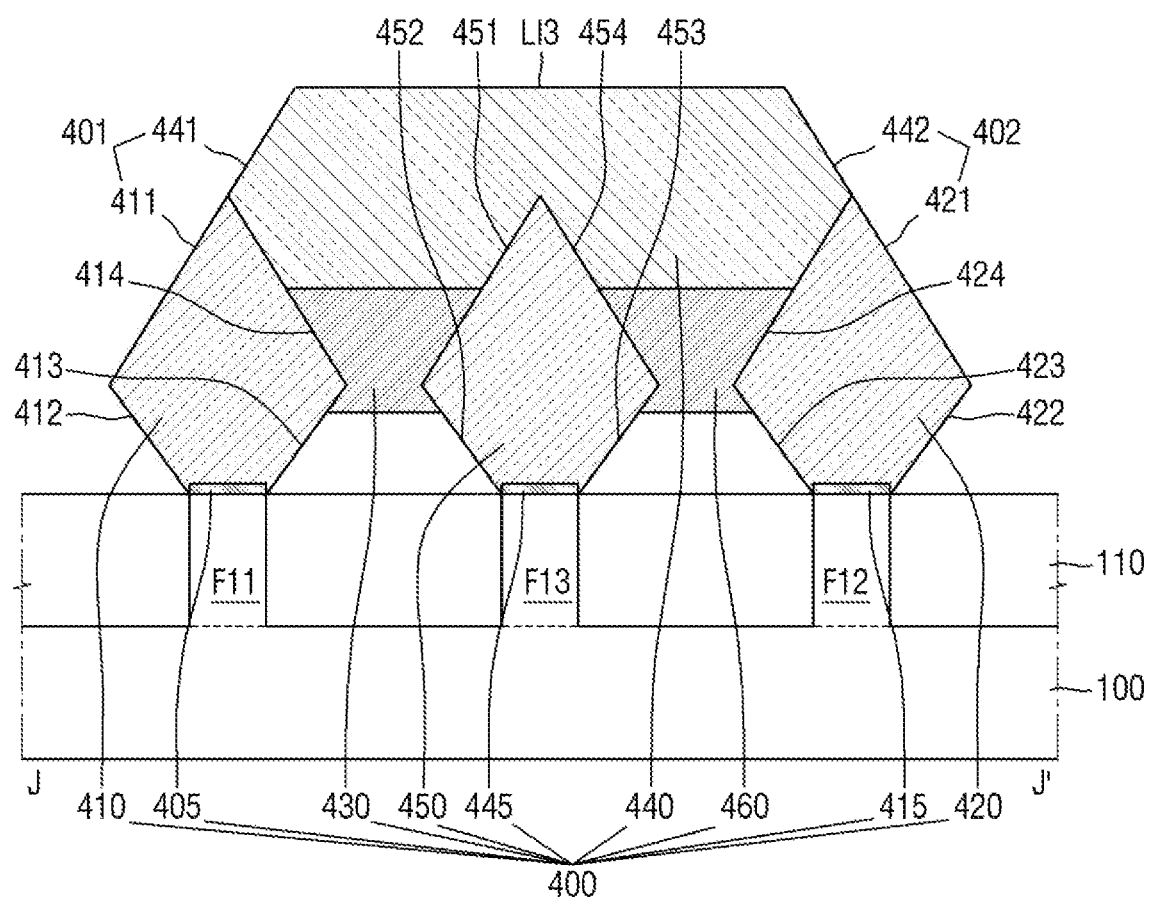
FIG. 14 is a cross-sectional view taken along the line J-J' of FIG. 13.
Figure 15:
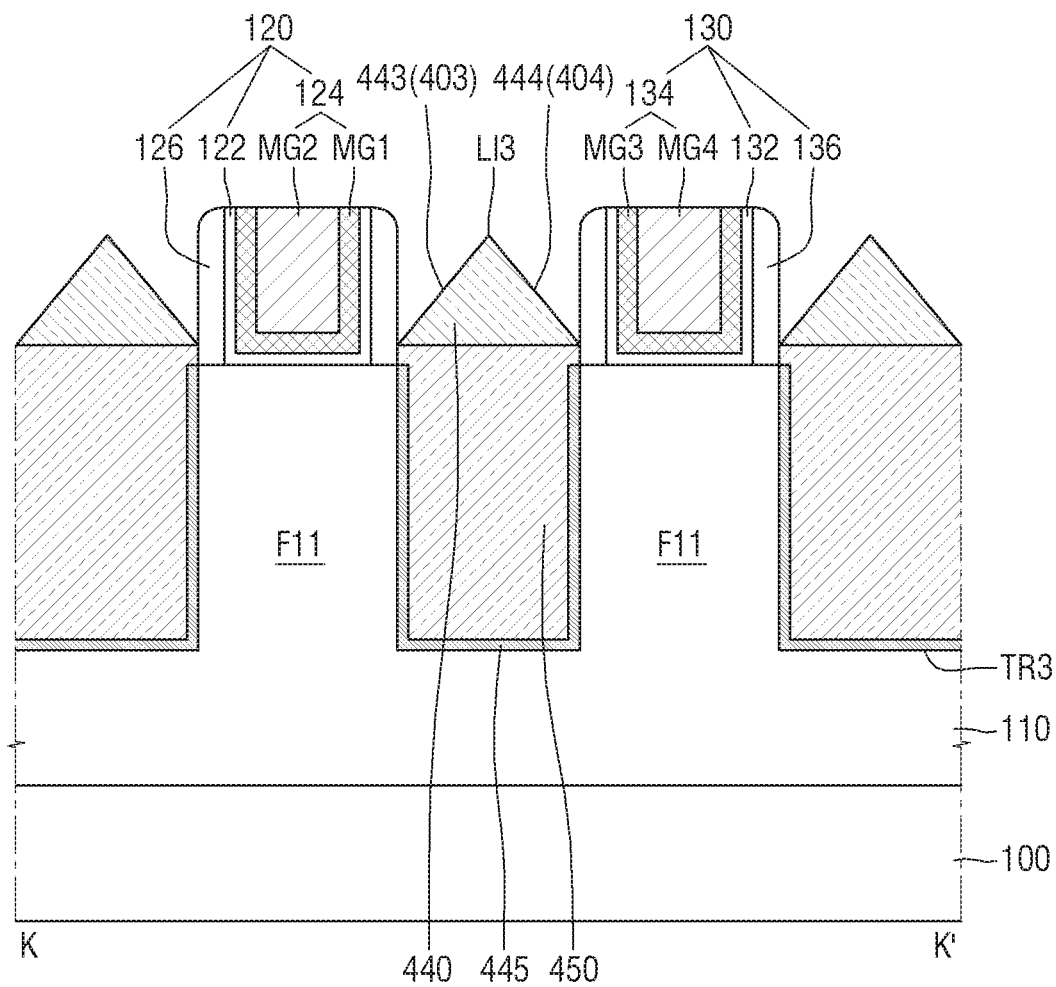
FIG. 15 is a cross-sectional view taken along the line K-K' of FIG. 13.

FIG. 13 is a perspective view illustrating a semiconductor device according to some embodiments of the present inventive concept. FIG. 14 is a cross-sectional view taken along the line J-J' of FIG. 13. FIG. 15 is a cross-sectional view taken along the line K-K' of FIG. 13. For the sake of convenience of explanation, duplicated portions of those described with reference to FIGS. 1 to 5 will be briefly described or omitted.

Referring also to FIGS. 13 to 15, the semiconductor device according to some embodiments further includes a third fin-type pattern F13 and includes a shared epitaxial pattern 400.

The third fin-type pattern F13 may protrude from the substrate 100 to extend between the first fin-type pattern F11 and the second fin-type pattern F12. The third fin-type pattern F13 may be formed adjacent to the first fin-type pattern F11 and the second fin-type pattern F12. That is, the third fin-type pattern F13 may extend along the second direction Y1 on the substrate 100.

The shared epitaxial pattern 400 may connect the first fin-type pattern F11, the second fin-type pattern F12, and the third fin-type pattern F13. Specifically, the shared epitaxial pattern 400 may include a first seed layer 405, a first epitaxial layer 410, a second seed layer 415, a second epitaxial layer 420, a third seed layer 445, a third epitaxial layer 450, a first connecting epitaxial layer 430, a second connecting epitaxial layer 460, and a capping epitaxial layer 440.

The third seed layer 445 may be formed on the third fin-type pattern F13. For example, the third seed layer 445 may be formed by epitaxial growth from the third fin-type pattern 113.

The third seed layer 445 may serve as a seed layer for growing the shared epitaxial pattern 400. However, in some embodiments, the third seed layer 445 may also be omitted.

The third epitaxial layer 450 may be formed on the third fin-type pattern F13. Specifically, a third trench TR3 may be formed in the third fin-type pattern F13 on both side surfaces of the gate structure. For example, as illustrated in FIG. 15, the third trench TR3 may be formed in the third fin-type pattern F13 between the first gate structure 120 and the second gate structure 130. At this time, the third epitaxial layer 450 may be formed to fill the third trench TR3. However, the present disclosure is not limited thereto, and the third epitaxial layer 450 may be formed on the third fin-type pattern F13 in which the third trench TR3 is not formed.

The cross section of the third epitaxial layer 450 may have a diamond shape (or a pentagonal shape or a hexagonal shape). For example, as illustrated in FIG. 14, the upper surface of the third epitaxial layer 450 may include a fifth upper slope 451 and a sixth upper slope 454 having the inclination with respect to the upper surface of the substrate 100. Further, the lower surface of the third epitaxial layer 450 may include a fifth lower slope 452 and a sixth lower slope 453 having the inclination with respect to the upper surface of the substrate 100. The fifth upper slope 451 may face the sixth lower slope 453, and the sixth upper slope 454 may face the fifth lower slope 452.

In some embodiments, the fifth upper slope 451, the sixth upper slope 454, the fifth lower slope 452, and the sixth lower slope 453 may have a {111} crystal surface.

The fifth lower slope 452 and the sixth lower slope 453 may form a part of the lower surface of the shared epitaxial pattern 400.

In FIGS. 13 and 14, the first epitaxial layer 410, the second epitaxial layer 420, and the third epitaxial layer 450 are illustrated in the state of being in non-contact with each other. However, the present disclosure is not limited thereto, and the first epitaxial layer 410, the second epitaxial layer 420, and the third epitaxial layer 450 may be in contact with each other. For example, when the distance between the first fin-type pattern F11 and the third fin-type pattern F13 or the distance between the second fin-type pattern F12 and the third fin-type pattern F13 approaches, the first epitaxial layer 410, the second epitaxial layer 420 and the third epitaxial layer 450 may be in contact with each other.

The first connecting epitaxial layer 430 may be interposed between the first epitaxial layer 410 and the third epitaxial layer 450 to connect the first epitaxial layer 410 and the third epitaxial layer 450. Specifically, the first connecting epitaxial layer 430 may be formed on the second upper slope 414 of the first epitaxial layer 410 and the fifth upper slope 451 of the third epitaxial layer 450. For example, the first connecting epitaxial layer 430 may cover at least a part of the second upper slope 414 and at least a part of the fifth upper slope 451.

The second connecting epitaxial layer 460 may be interposed between the second epitaxial layer 420 and the third epitaxial layer 450 to connect the second epitaxial layer 420 and the third epitaxial layer 450. Specifically, the second connecting epitaxial layer 460 may be formed on the fourth upper slope 424 of the second epitaxial layer 420 and the sixth upper slope 454 of the third epitaxial layer 450. For example, the second connecting epitaxial layer 460 may cover at least a part of the fourth upper slope 424 and at least a part of the sixth upper slope 454.

The capping epitaxial layer 440 may be formed on the first epitaxial layer 410, the second epitaxial layer 420, the third epitaxial layer 450, the first connecting epitaxial layer 430, and the second connecting epitaxial layer 460. The capping epitaxial layer 440 may be formed by the epitaxial growth, from the first epitaxial layer 410, the second epitaxial layer 420, the third epitaxial layer 450, the first connecting epitaxial layer 430, and the second connecting epitaxial layer 460. At this time, the uppermost part of the capping epitaxial layer 440 may be higher than the uppermost part of the first epitaxial layer 410, the uppermost part of the second epitaxial layer 420, the uppermost part of the third epitaxial layer 450, the uppermost part of the first connecting epitaxial layer 430, and the uppermost part of the second connecting epitaxial layer 460.

In some embodiments, as illustrated in FIG. 15, the lower surface of the capping epitaxial layer 440 may be lower than the upper surface of the first fin-type pattern F11 or the second fin-type pattern F12.

The upper surface of the shared epitaxial pattern 400 may include a first shared slope 401, a second shared slope 402, a third shared slope 403, and a fourth shared slope 404.

As illustrated in FIG. 14, the first upper slope 411 and the first capping slope 441 may form the first shared slope 401 which is one of the upper surfaces of the shared epitaxial pattern 400. Also, the third upper slope 421 and the second capping slope 442 may form a second shared slope 402 which is one of other upper surfaces of the shared epitaxial pattern 400.

As illustrated in FIG. 15, the third capping slope 443 may form a third shared slope 403 which is one of other upper surfaces of the shared epitaxial pattern 400. The fourth capping slope 444 may form a fourth shared slope 404 which is one of other upper surfaces of the shared epitaxial pattern 400.

In some embodiments, the third shared slope 403 and the fourth shared slope 404 may intersect with each other between the gate structures. For example, the third shared slope 403 and the fourth shared slope 404 may intersect with each other between the first gate structure 120 and the second gate structure 130 to form a third intersection line LI3. The uppermost part of the third shared slope 403 and the uppermost part of the fourth shared slope 404 may be formed on the third intersection line LI3.

As illustrated, when the third shared slope 403 and the fourth shared slope 404 form the third intersection line LI3, the third intersection line LI3 may extend along the first direction X1. That is, the third shared slope 403 may connect the first shared slope 401 and the second shared slope 402. Similarly, the fourth shared slope 404 may connect the first shared slope 401 and the second shared slope 402. Accordingly, the uppermost part of the first shared slope 401 and the uppermost part of the second shared slope 402 may be connected by the third intersection line LI3.

Hereinafter, a method for fabricating a semiconductor device according to some embodiments of the present inventive concept will be described with reference to FIGS. 16 to 27.

FIGS. 16 to 27 are intermediate step diagrams illustrating the method for fabricating the semiconductor device according to some embodiments of the present inventive concept. For the sake of convenience of explanation, duplicated portions of those described with reference to FIGS. 1 to 5 will be briefly described or omitted.

Figure 16:
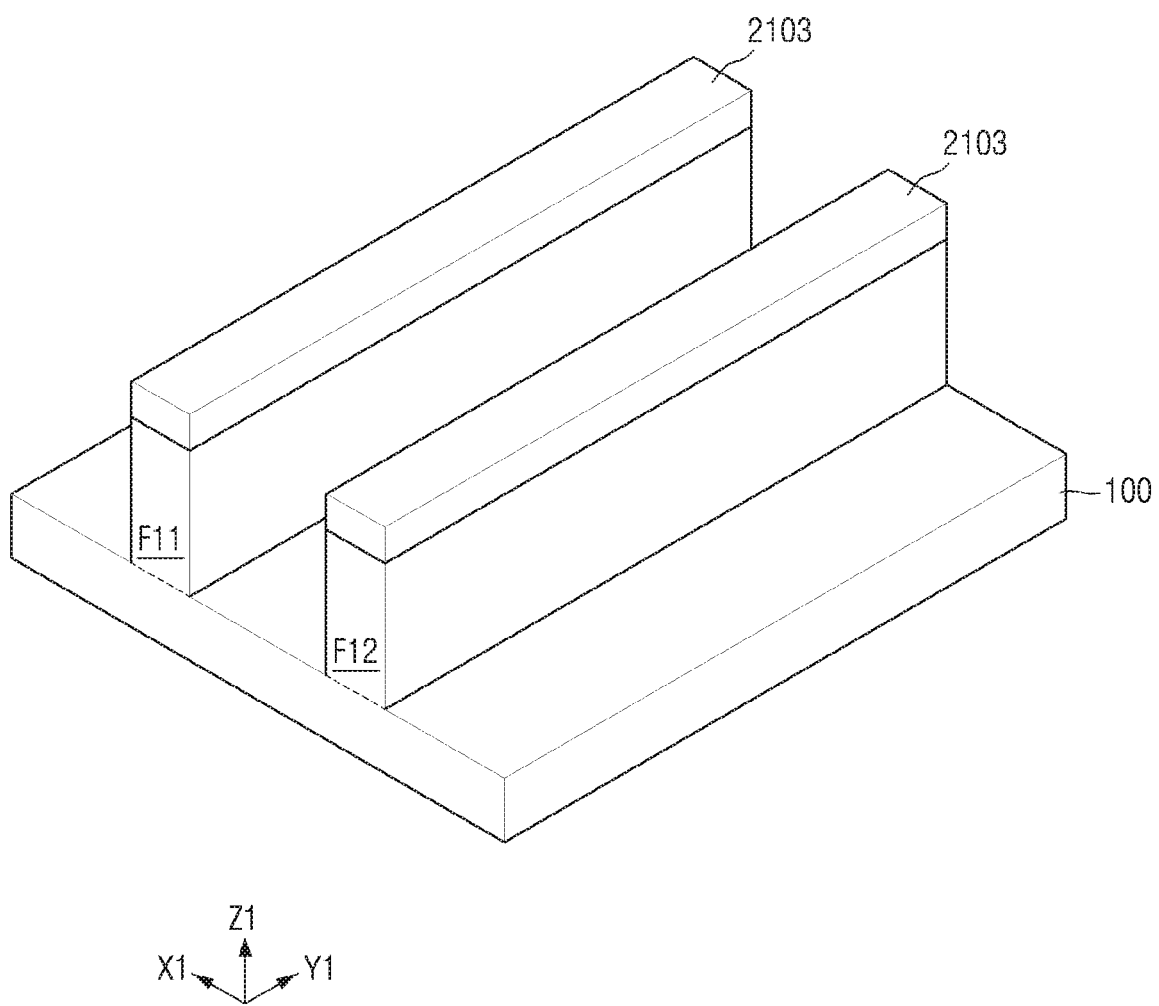
FIGS. 16 to 27 illustrate a method for fabricating a semiconductor device according to some embodiments of the present inventive concept.

Referring to FIG. 16, the first fin-type pattern F11 and the second fin-type pattern F12 are formed on the substrate 100. Specifically, after forming the first mask pattern 2103 on the substrate 100, by performing the etching process, the first fin-type pattern F11 and the second fin-type pattern F12 may be formed. The first fin-type pattern F11 and the second fin-type pattern F12 may be adjacent to each other and may extend along the second direction Y1. The first mask pattern 2103 may include at least one of, for example, a silicon oxide film, a silicon nitride film, a silicon oxynitride film, or a combination thereof.

Figure 17:
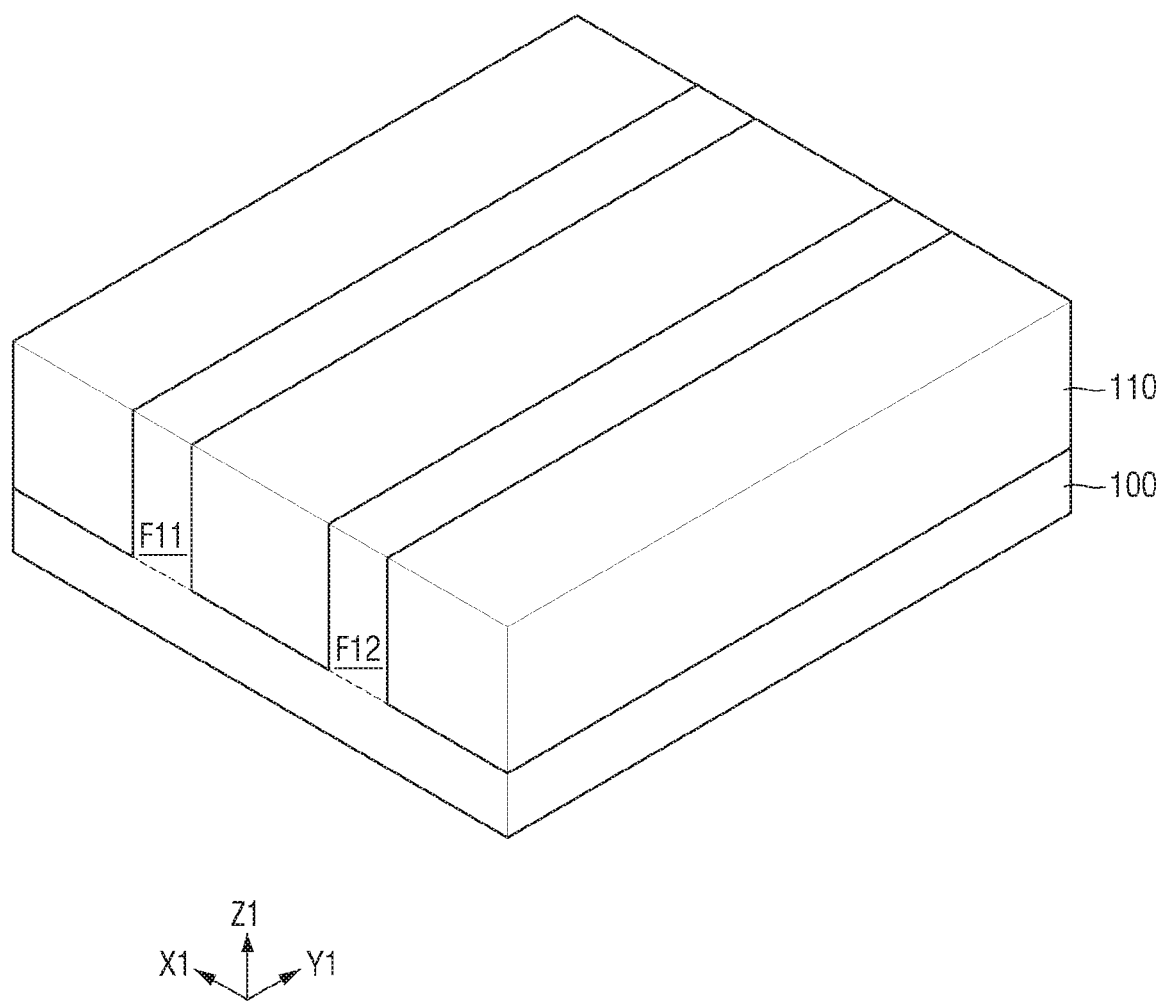

Referring to FIG. 17, a field insulating film 110 is formed on the substrate 100 to cover the side surfaces of the first fin-type pattern F11 and the side surfaces of the second fin-type pattern F12. The field insulating film 110 may include, for example, one of an oxide film, a nitride film, an oxynitride film, or a combination thereof.

Figure 18:
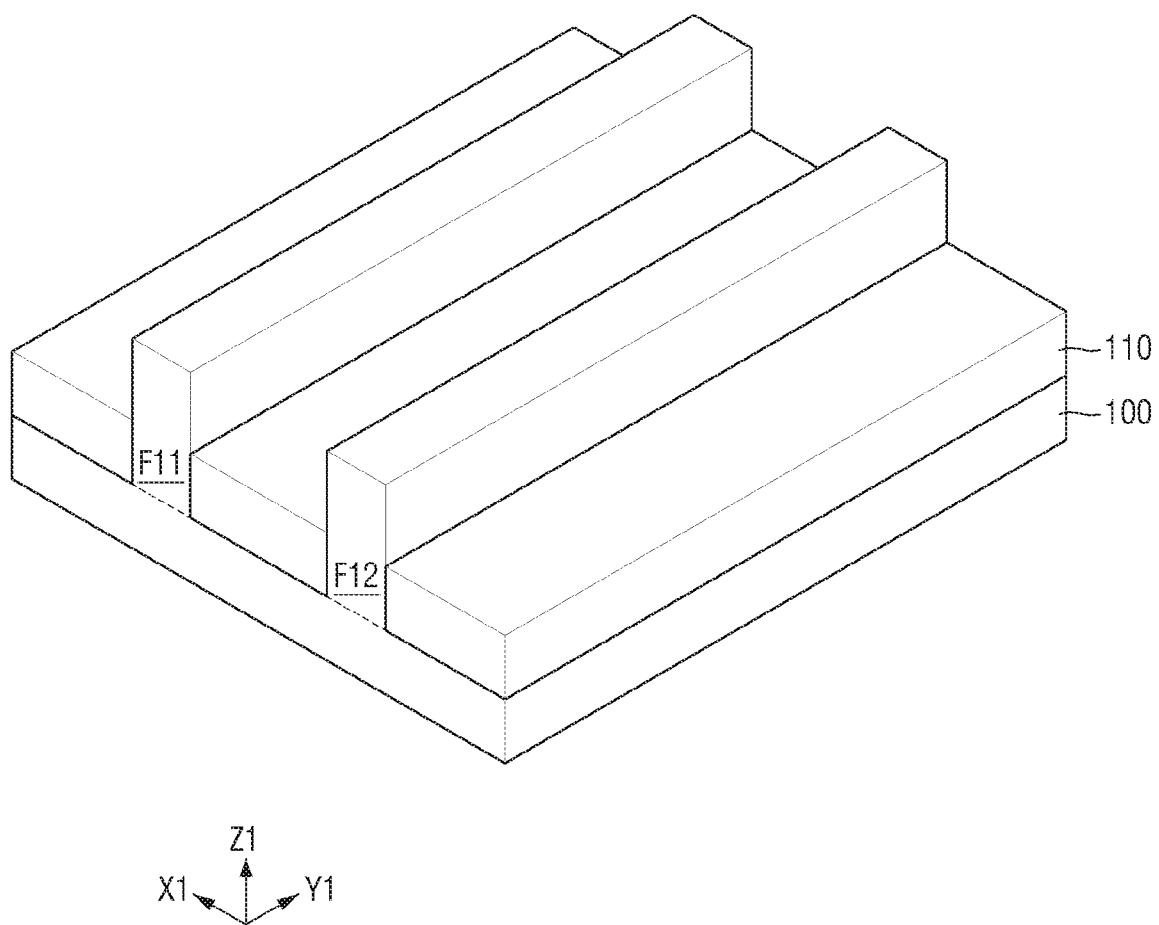

Referring to FIG. 18, the upper part of the field insulating film 110 is recessed to expose the upper portion of the first fin-type pattern F11 and the upper portion of the second fin-type pattern F12. The recess process may include an optional etching process. The first mask pattern 2103 may be removed before forming the field insulating film 110 or may be removed after the recess process.

Meanwhile, a part of the first fin-type pattern F11 and a part of the second fin-type pattern F12 protruding upward from the field insulating film 110 may also be formed by an epitaxial process. Specifically, after forming the field insulating film 110, an epitaxial process of using the upper surface of the first fin-type pattern F11 and the upper surface of the second fin-type pattern F12 exposed by the field insulating film 110 as a seed may be performed, without a recess process. Accordingly, a part of the first fin-type pattern F11 and a part of the second fin-type pattern F12 may be formed.

Further, doping for adjusting a threshold voltage may be performed on the first fin-type pattern F11 and the second fin-type pattern F12. For example, when forming a PMOS transistor, doping with phosphorus (P) or arsenic (As) as an impurity may be performed. For example, when forming an NMOS transistor, doping with boron (B) as an impurity may be performed.

Figure 19:
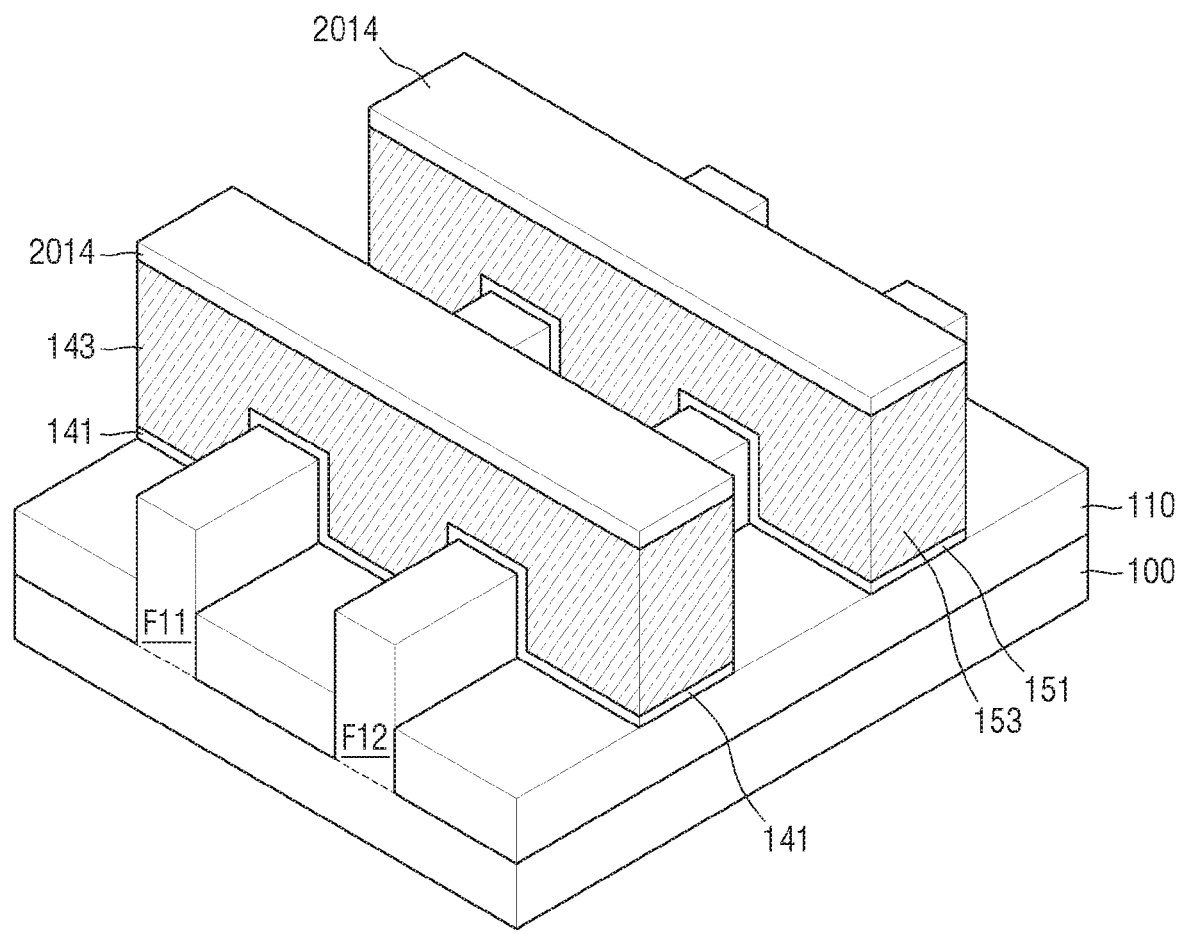

Referring to FIG. 19, an etching process is performed using the mask pattern 2014. Thus, a first dummy gate insulating film 141, a first dummy gate electrode 143, a second dummy gate insulating film 151, and a second dummy gate electrode 153 intersecting with the first fin-type pattern F11 and the second fin-type pattern F12 and each extending in the first direction X1 are formed.

The first dummy gate insulating film 141 and the second dummy gate insulating film 151 may be, for example, silicon oxide films. The first dummy gate electrode 143 and the second dummy gate electrode 153 may be, for example, polysilicon.

Figure 20:
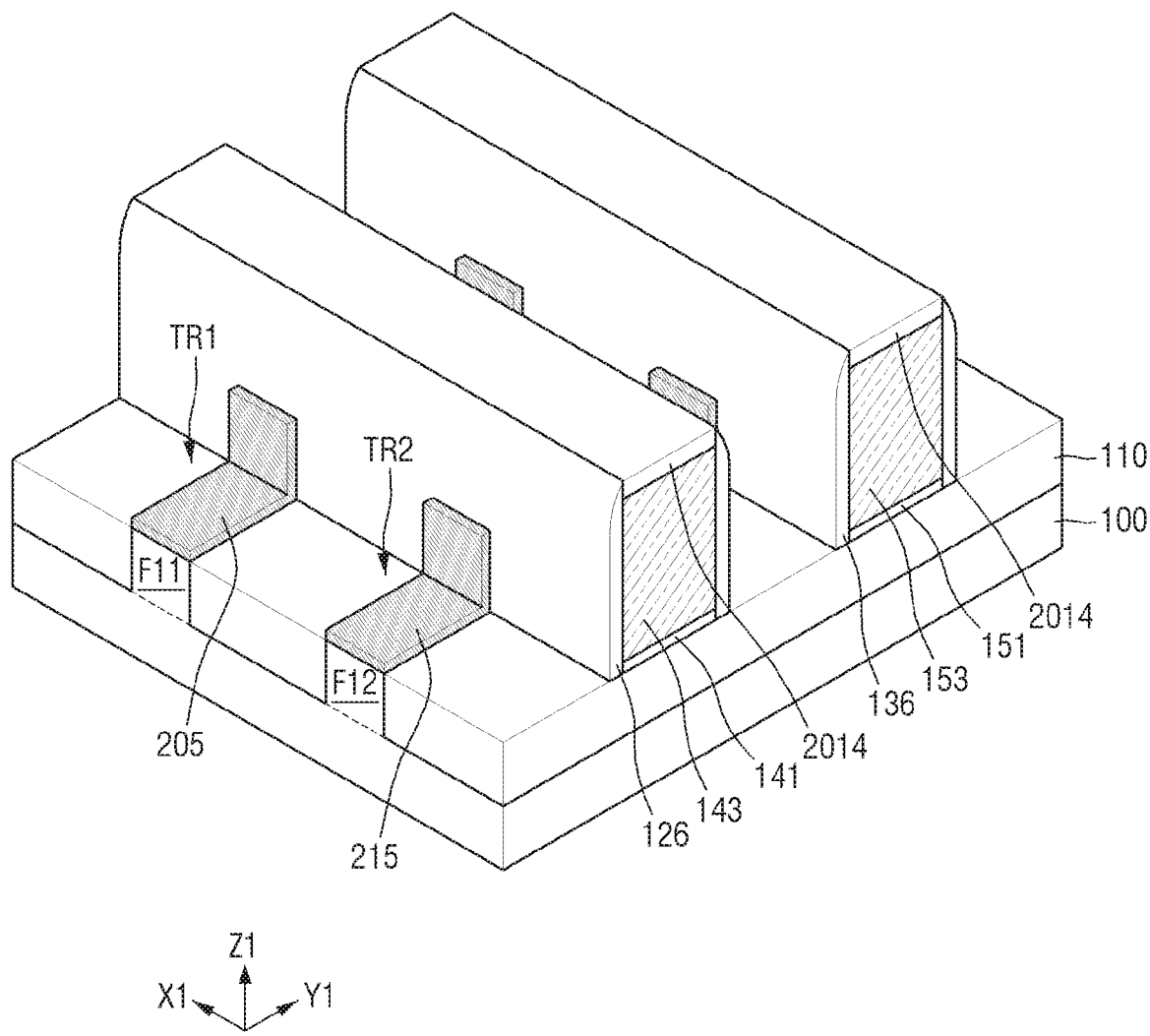

Referring to FIG. 20, a first gate spacer 126 is formed on the sidewall of the first dummy gate electrode 143, a second gate spacer 136 is formed on the sidewall of the second dummy gate electrode 153, and the upper surface of the mask pattern 2014 is exposed. The first gate spacer 126 and the second gate spacer 136 may be, for example, a silicon nitride film or a silicon oxynitride film.

subsequently, a part of the first fin-type pattern F11 exposed on both sides of the first dummy gate electrode 143 is removed to form the first trench TR1. Further, a part of the second fin-type pattern F12 exposed on both sides of the second dummy gate electrode 153 is removed to form the second trench TR2.

subsequently, a first seed layer 205 is formed in the first trench TR1 along the surface of the first fin-type pattern F11. Further, a second seed layer 215 is formed in the second trench TR2 along the surface of the second fin-type pattern F12. The first seed layer 205 and the second seed layer 215 may be formed through an epitaxial process.

Figure 21:
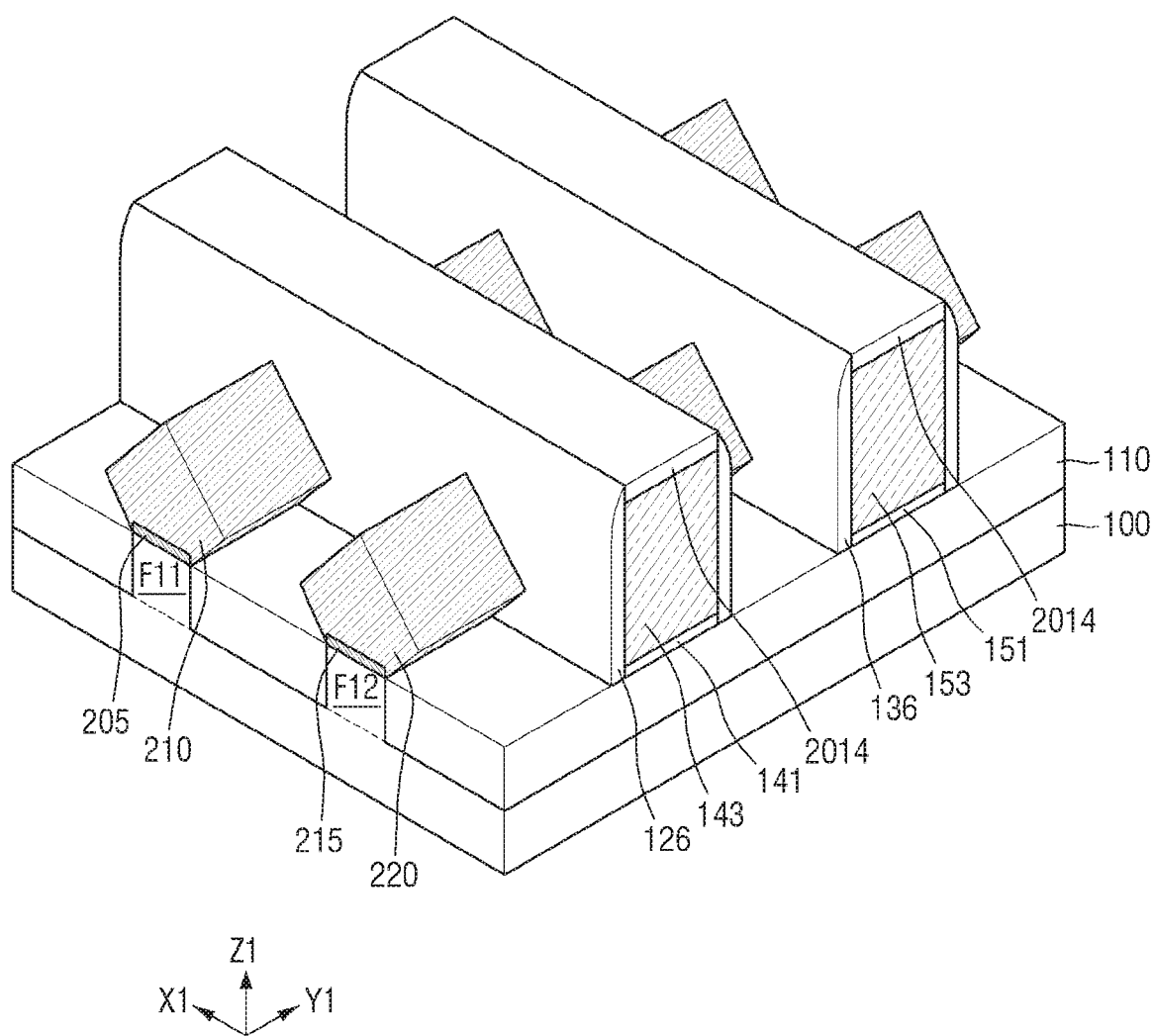

Referring to FIG. 21, the first epitaxial layer 210 is formed on the first fin-type pattern F11, the second epitaxial layer 220 is formed on the second fin-type pattern F12. Specifically, the first epitaxial layer 210 is formed on the first seed layer 205 in the first trench TR1, and the second epitaxial layer 220 is formed on the second seed layer 215 in the second trench TR2. The first epitaxial layer 210 and the second epitaxial layer 220 may be formed by an epitaxial process.

Figure 22:
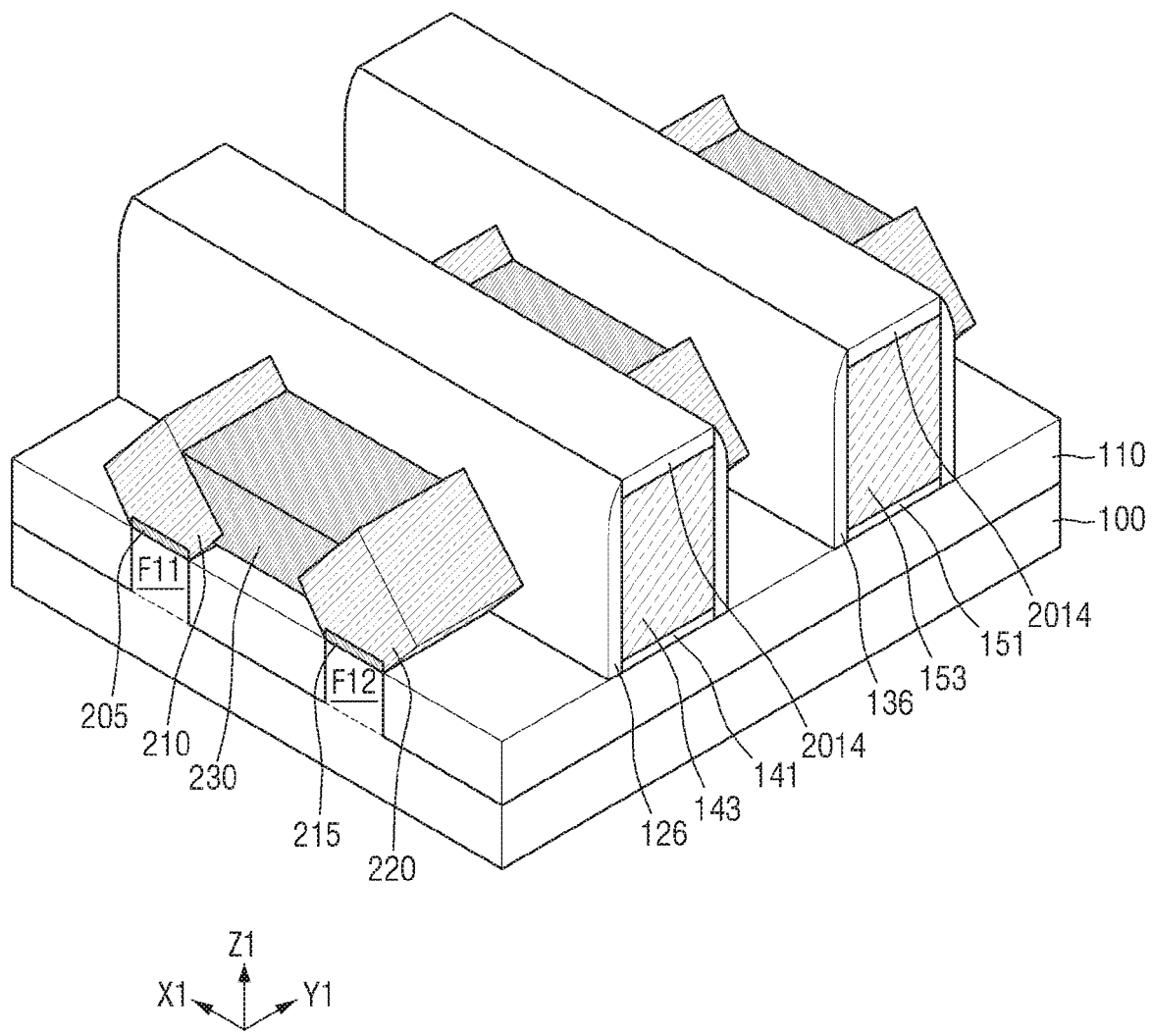

Referring to FIG. 22, a connecting epitaxial layer 230 is formed between the first epitaxial layer 210 and the second epitaxial layer 220. The connecting epitaxial layer 230 may be formed by the epitaxial process.

Specifically, a connecting epitaxial layer 230 may be formed to connect the first epitaxial layer 210 and the second epitaxial layer 220. The space between the connecting epitaxial layer 230 and the field insulating film 110 may be empty, but the space may be filled by future processes. When the distance between the first epitaxial layer 210 and the second epitaxial layer 220 is short, the connecting epitaxial layer 230 may be easily formed by being accumulated between the first epitaxial layer 210 and the second epitaxial layer 220. In some embodiments, the connecting epitaxial layer 230 may be formed of multi-films.

Figure 23:
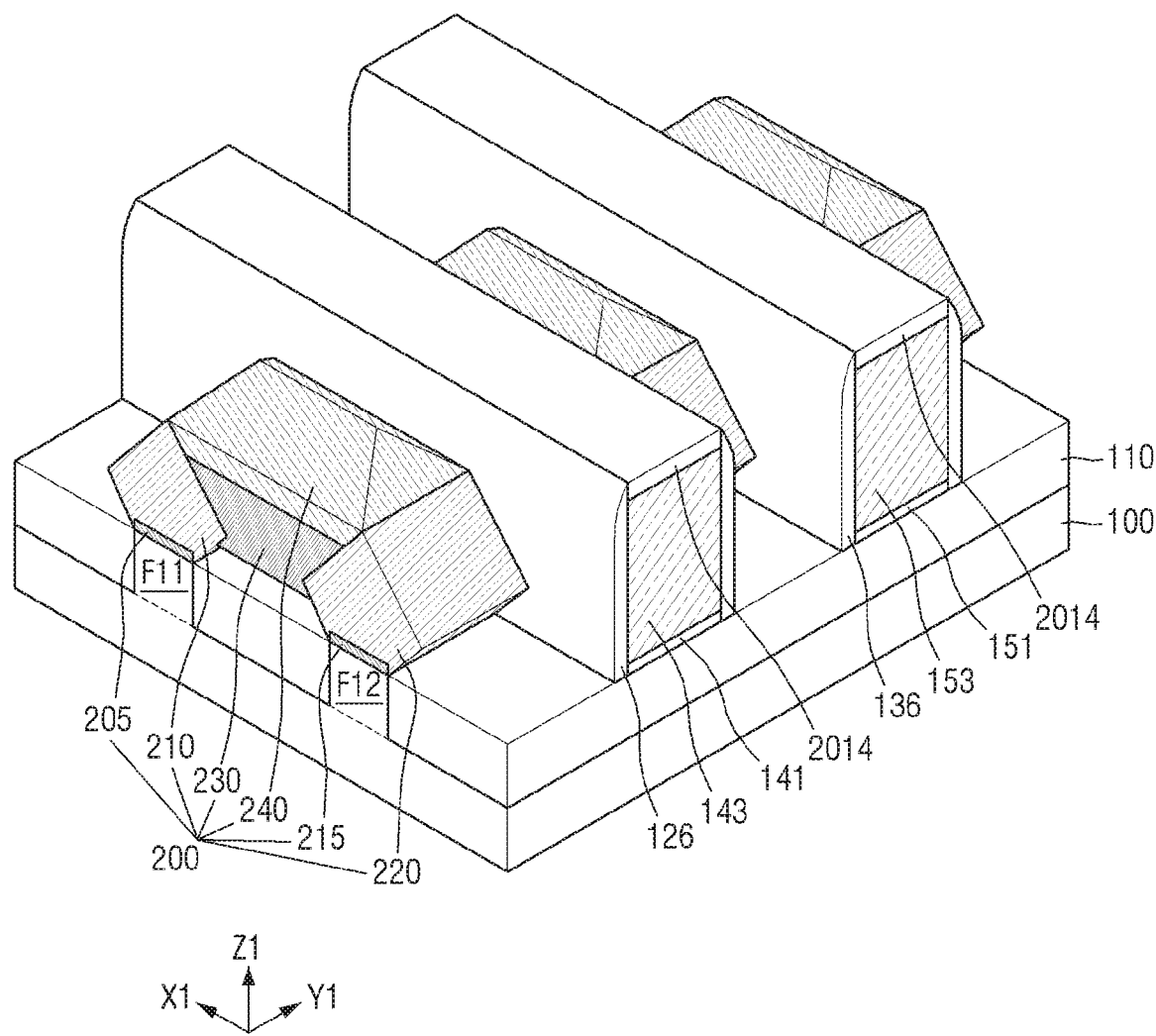

Referring to FIG. 23, a capping epitaxial layer 240 is formed on the first epitaxial layer 210, the second epitaxial layer 220, and the connecting epitaxial layer 230. Thus, a shared epitaxial pattern 200 may be formed. The capping epitaxial layer 240 may be formed by an epitaxial process.

Specifically, the capping epitaxial layer 240 may be formed such that the uppermost part of the capping epitaxial layer 240 is higher than the uppermost part of the first epitaxial layer 210, the uppermost part of the second epitaxial layer 220, and the uppermost part of the connecting epitaxial layer 230. When the distance between the first epitaxial layer 210 and the second epitaxial layer 220 is short, the capping epitaxial layer 240 may be easily formed by being accumulated between the first epitaxial layer 210 and the second epitaxial layer 220 on the connecting epitaxial layer 230. In some embodiments, the capping epitaxial layer 240 may be formed of multi-films.

Figure 24:
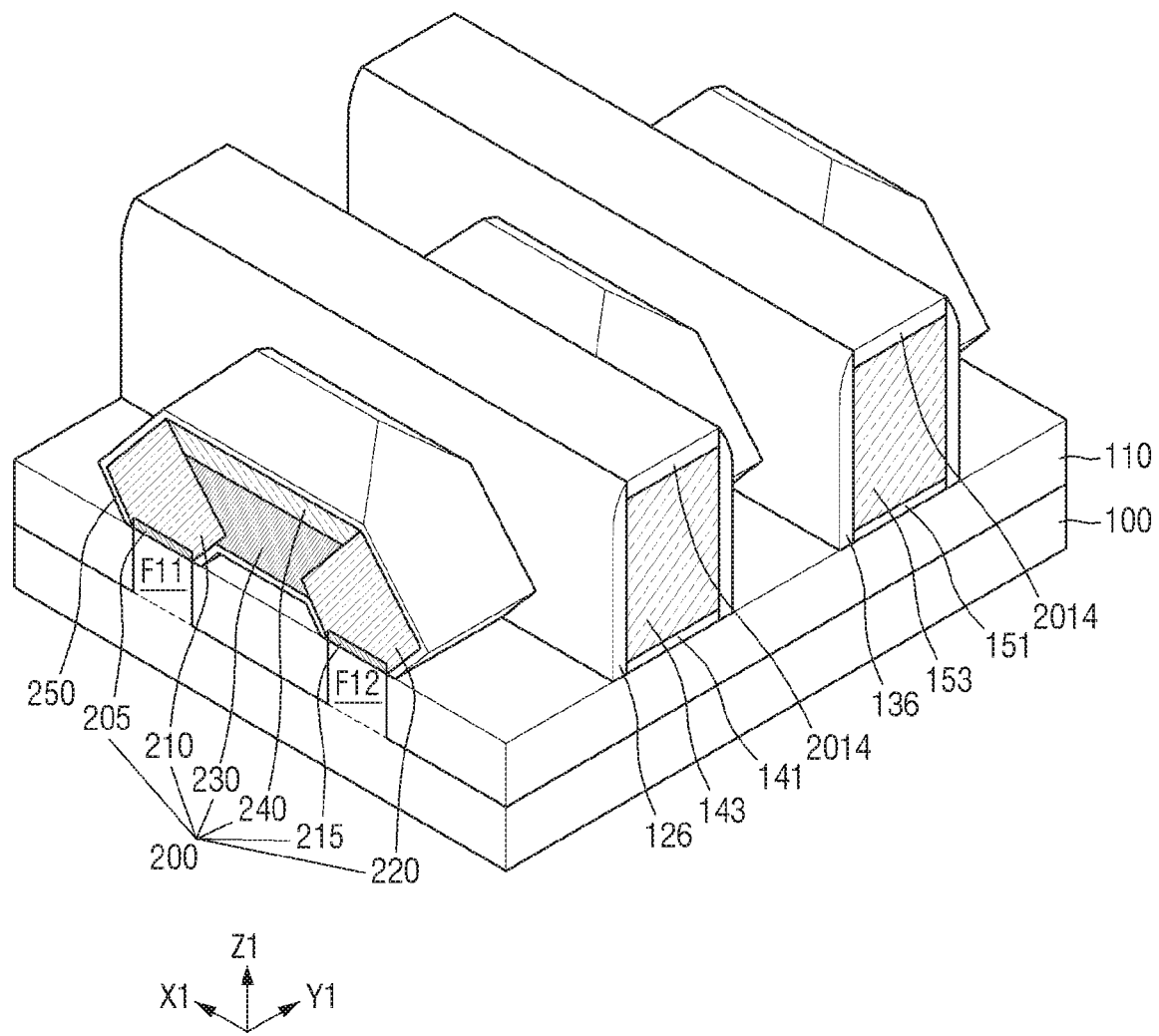

Referring to FIG. 24, a protective layer 250 is formed on the shared epitaxial pattern 200. The protective layer 250 may be formed by an epitaxial process.

Specifically, the protective layer 250 may be formed to cover the surface of the shared epitaxial pattern 200. The protective layer 250 may not contain the first substance. For example, when forming the PMOS transistor, the protective layer 250 may not contain Ge which is a compressive stress substance.

Figure 25:
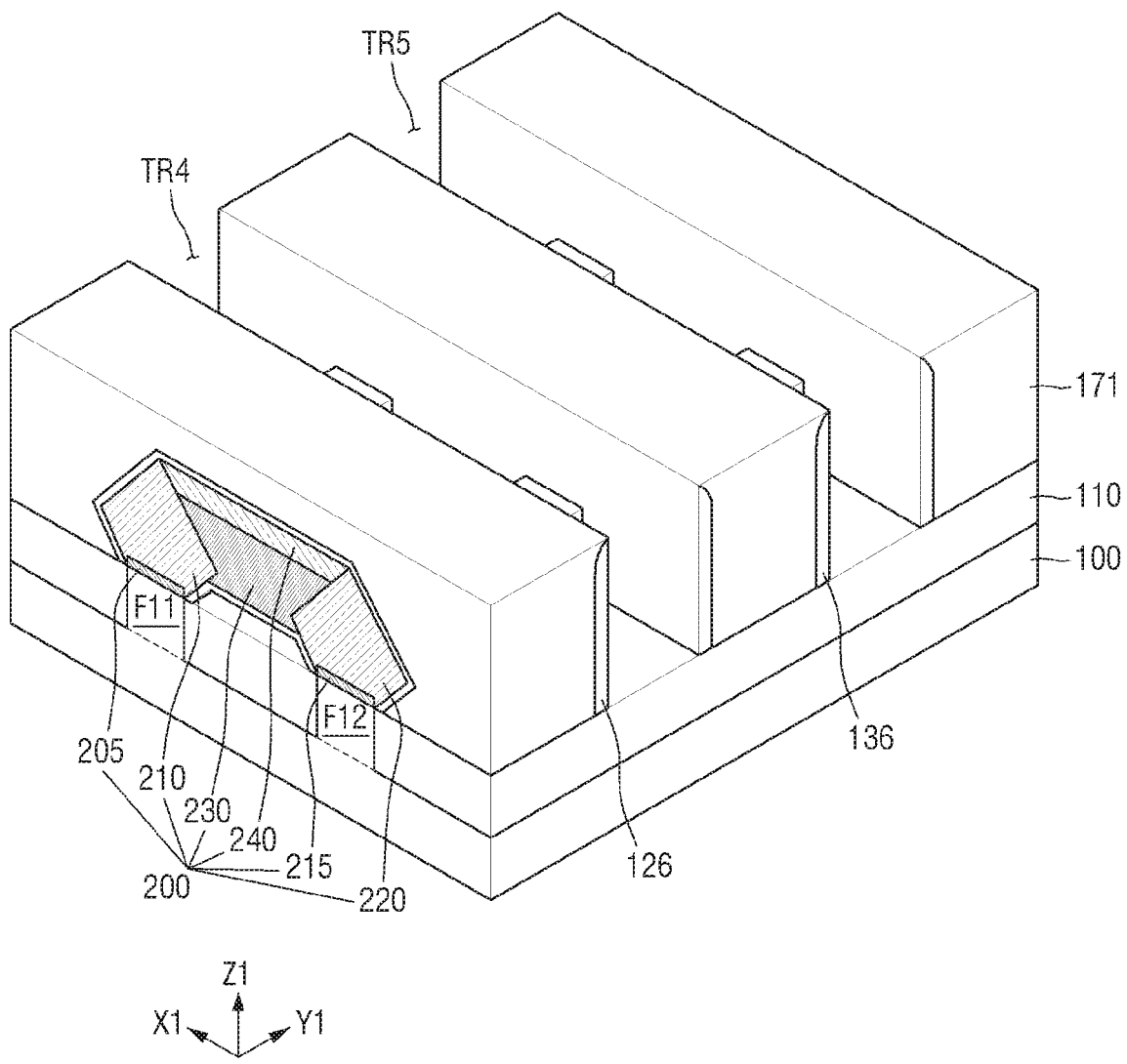

Referring to FIG. 25, a first interlayer insulating film 171 is formed on the resulting product of FIG. 24. The first interlayer insulating film 171 may include, for example, at least one of an oxide film, a nitride film, and an oxynitride film.

Subsequently, the first interlayer insulating film 171 is planarized until the upper surface of the first dummy gate electrode 143 and the upper surface of the second dummy gate electrode 153 are exposed. As a result, the mask pattern 2014 may be removed, and the upper surface of the first dummy gate electrode 143 and the upper surface of the second dummy gate electrode 153 may be exposed.

Subsequently, the first dummy gate insulating film 141, the second dummy gate insulating film 151, the first dummy gate electrode 143, and the second dummy gate electrode 153 are removed. As the first dummy gate insulating film 141, the second dummy gate insulating film 151, the first dummy gate electrode, 143 and the second dummy gate electrode 153 are removed, a fourth trench TR4 and a fifth trench TR5 through which the field insulating film 110 is exposed may be formed.

Figure 26:
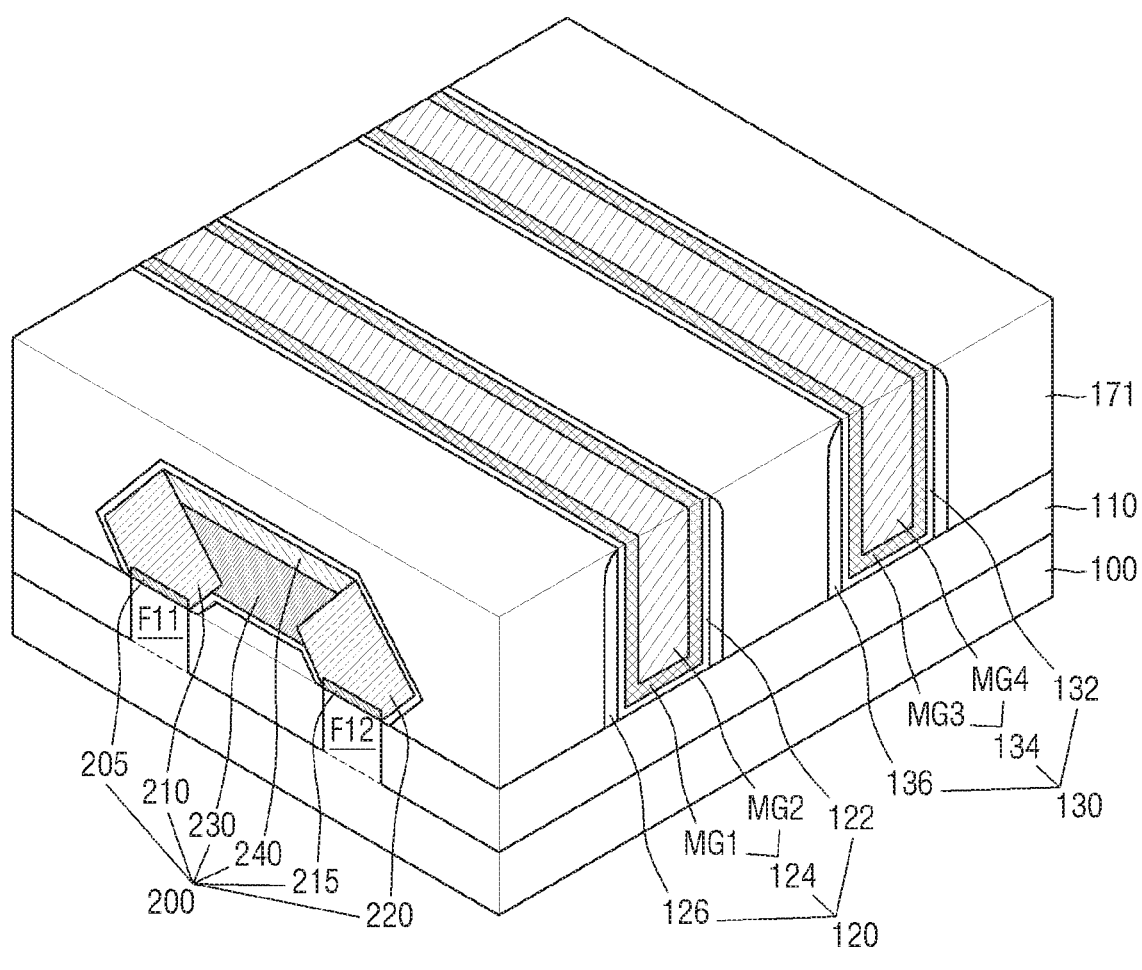
Figure 27:
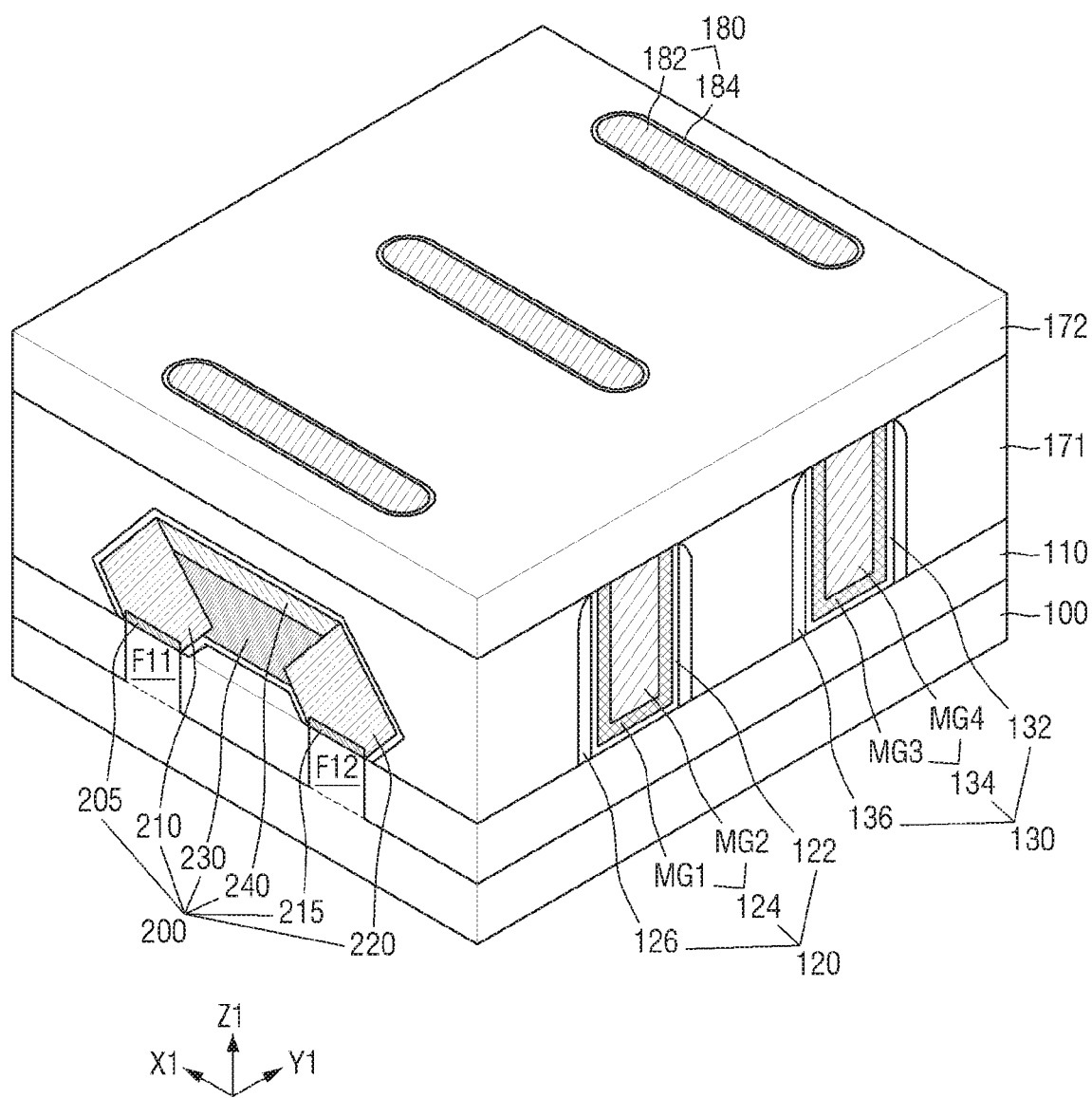

Referring to FIG. 26, a first gate insulating film 122 is formed in the fourth trench TR4, and a first gate electrode 124 is formed on the first gate insulating film 122. Further, a second gate insulating film 132 is formed in the fifth trench TR5, and a second gate electrode 134 is formed on the second gate insulating film 132. Therefore, the first gate structure 120 may be formed in the fourth trench TR4, and the second gate structure 130 may be formed in the fifth trench TR5.

Specifically, the first gate insulating film 122 may be conformally formed along the sidewall and the lower surface of the fourth trench TR4. Further, the second gate insulating film 132 may be conformally formed along the sidewall and the lower surface of the fifth trench TR5. The first gate insulating film 122 and the second gate insulating film 132 may include, for example, a high dielectric substance having a dielectric constant higher than that of the silicon oxide film.

The first gate electrode 124 may include a metal layer. As illustrated, the first gate electrode 124 may be formed by sequentially laminating the first metal layer MG1 and the second metal layer MG2 on the first gate insulating film 122. As with the first gate electrode 124, the second gate electrode 134 may include a metal layer. As illustrated, the second gate electrode 134 may be formed by sequentially laminating the third metal layer MG3 and the fourth metal layer MG4 on the second gate insulating film.

The first metal layer MG1 and the third metal layer MG3 may contain, for example, at least one of TiN, TaN, TiC, TaC, TiAl, and TiAlC. Further, the second metal layer MG2 and the fourth metal layer MG4 may contain, for example, at least one of W, Al, TiN, and Co.

Referring to FIGS. 6 to 9 and 27, a second interlayer insulating film 172 is formed on the resulting product of FIG. 26. The second interlayer insulating film 172 may include, for example, at least one of an oxide film, a nitride film, and an oxynitride film.

Subsequently, a contact hole CH which penetrates through the first interlayer insulating film 171 and the second interlayer insulating film 172 and penetrates through a part of the shared epitaxial pattern 200 is formed. Since the capping epitaxial layer 240 of the shared epitaxial pattern 200 is formed to be high, it is possible to prevent the problem such as an occurrence of a short circuit due to excessive etching of the epitaxial pattern in the process of forming the contact hole CH. Further, the protective layer 250 having a low etching ratio may reduce the etching amount of the shared epitaxial pattern 200.

Subsequently, a contact 180 is formed to fill the contact hole CH. The contact 180 may include a silicide film 181, a first conductive film 182, and a second conductive film 184 formed on the lower surface of the contact hole CH. Specifically, the first conductive film 182 may be conformally formed along the sidewall of the contact hole CH and the upper surface of the silicide film 181. The second conductive film 184 may be formed to fill the contact hole CH on the first conductive film 182.

The silicide film 181 may contain, for example, Pt, Ni, Co, etc., but the present disclosure is not limited thereto.

The first conductive film 182 may contain, for example, Ti or TiN, and the second conductive film 184 may contain, for example, W, Al, Cu or the like, but the technical idea is not limited thereto.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A semiconductor device comprising:
    a first fin-type pattern and a second fin-type pattern which extend across a substrate along a first direction, respectively;
    a first gate structure and a second gate structure which are spaced apart from each other and extend in a second direction intersecting the first direction such that the first and second fin-type patterns cross the first and second gate structures, respectively; and
    a shared epitaxial pattern which connects the first fin-type pattern and the second fin-type pattern between the first gate structure and the second gate structure,
    wherein the shared epitaxial pattern includes a capping epitaxial layer,
    wherein an upper surface of the capping epitaxial layer includes
    a first shared slope and a second shared slope which connect the first gate structure and the second gate structure,
    a third shared slope which is in contact with the first gate structure and connects the first shared slope and the second shared slope, and
    a fourth shared slope which is in contact with the second gate structure and connects the first shared slope and the second shared slope, and
    wherein the third shared slope and the fourth shared slope meet between the first gate structure and the second gate structure to form an intersection line, which extends along the second direction such that the intersection line crosses the first and second fin type patterns.

2. The semiconductor device of claim 1, wherein the third shared slope and the fourth shared slope have a triangular shape or a trapezoidal shape.

3. The semiconductor device of claim 1, wherein the first shared slope and the second shared slope have a pentagonal shape or a hexagonal shape.

4. The semiconductor device of claim 1, wherein the first shared slope, the second shared slope, the third shared slope, and the fourth shared slope have a {111} crystal surface.

5. The semiconductor device of claim 1, further comprising:
    a third fin-type pattern which extends in the first direction between the first fin-type pattern and the second fin-type pattern on the substrate,
    wherein the shared epitaxial pattern connects the first fin-type pattern, the second fin-type pattern, and the third fin-type pattern.

6. The semiconductor device of claim 1, further comprising:
    a field insulating film which fills a space between the first fin-type pattern and the second fin-type pattern on the substrate; and
    an air gap interposed between the shared epitaxial pattern and the field insulating film.

7. A semiconductor device comprising:
    a first fin-type pattern and a second fin-type pattern on a substrate; and
    a shared epitaxial pattern which connects the first fin-type pattern and the second fin-type pattern,
    wherein the shared epitaxial pattern includes
    a first epitaxial layer on the first fin-type pattern,
    a second epitaxial layer on the second fin-type pattern,
    a first connecting epitaxial layer interposed between the first epitaxial layer and the second epitaxial layer, and
    a capping epitaxial layer on the first epitaxial layer, the second epitaxial layer and the first connecting epitaxial layer,
    an uppermost part of the capping epitaxial layer being higher than an uppermost part of the first epitaxial layer, an uppermost part of the second epitaxial layer, and an uppermost part of the first connecting epitaxial layer.,
    an upper surface of the first epitaxial layer includes a first upper slope which has a first non-zero inclination with respect to an upper surface of the substrate and is not in contact with the first connecting epitaxial layer,
    an upper surface of the second epitaxial layer includes a second upper slope which has a second non-zero inclination with respect to the upper surface of the substrate and is not in contact with the first connecting epitaxial layer, and
    an upper surface of the capping epitaxial layer includes a first capping slope being substantially coplanar with the first upper slope, and a second capping slope being substantially coplanar with the second upper slope.

8. The semiconductor device of claim 7, wherein an upper surface of the first epitaxial layer includes a first upper slope which has a first non-zero inclination with respect to an upper surface of the substrate and is not in contact with the first connecting epitaxial layer,
    an upper surface of the second epitaxial layer includes a second upper slope which has a second non-zero inclination with respect to the upper surface of the substrate and is not in contact with the first connecting epitaxial layer, and
    an upper surface of the capping epitaxial layer includes a first capping slope extending from the first upper slope, and a second capping slope extending from the second upper slope.

9. The semiconductor device of claim 7, wherein the first epitaxial layer and the second epitaxial layer are in contact with each other.

10. The semiconductor device of claim 7, further comprising:
    a third fin-type pattern interposed between the first fin-type pattern and the second fin-type pattern on the substrate,
    wherein the shared epitaxial pattern further includes a third epitaxial layer on the third fin-type pattern, and a second connecting epitaxial layer,
    the first connecting epitaxial layer connects the first epitaxial layer and the third epitaxial layer, and the second connecting epitaxial layer connects the second epitaxial layer and the third epitaxial layer.

11. The semiconductor device of claim 7, wherein the first epitaxial layer and the second epitaxial layer include a first substance of a first concentration, and the first connecting epitaxial layer includes the first substance of a second concentration different from the first concentration.

12. The semiconductor device of claim 11, wherein the capping epitaxial layer includes the first substance of a third concentration different from the second concentration.

13. The semiconductor device of claim 7, wherein each of the first fin-type pattern and the second fin-type pattern extends along a first direction, a first gate structure and a second gate structure spaced apart from each other and extending in a second direction intersecting with the first direction are further disposed on the first fin-type pattern and the second fin-type pattern, and the shared epitaxial pattern connects the first fin-type pattern and the second fin-type pattern between the first gate structure and the second gate structure.

* * * * *